United States Patent
Song et al.

(10) Patent No.: US 7,939,366 B2
(45) Date of Patent: May 10, 2011

(54) PHASE CHANGE MEMORY DEVICES AND METHODS OF FORMING THE SAME

(75) Inventors: Yoon-Jong Song, Seoul (KR); Seung-Pil Ko, Suwon-si (KR); Dong-Won Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 215 days.

(21) Appl. No.: 12/219,647

(22) Filed: Jul. 25, 2008

(65) Prior Publication Data
US 2009/0026436 A1 Jan. 29, 2009

(30) Foreign Application Priority Data
Jul. 25, 2007 (KR) .................. 10-2007-0074619

(51) Int. Cl.
*H01L 21/06* (2006.01)
(52) U.S. Cl. ................. 438/102; 438/103; 257/3; 257/4
(58) Field of Classification Search .................. 438/102, 438/103; 257/3, 4
See application file for complete search history.

(56) References Cited

U.S. PATENT DOCUMENTS

| 6,764,894 | B2 | 7/2004 | Lowrey |
| 2005/0250316 | A1* | 11/2005 | Choi et al. ................ 438/637 |
| 2007/0210348 | A1 | 9/2007 | Song et al. |
| 2008/0042117 | A1* | 2/2008 | Hsu ................................ 257/3 |
| 2008/0316793 | A1* | 12/2008 | Philipp et al. ............... 365/148 |

FOREIGN PATENT DOCUMENTS

| JP | 2005-525690 | 8/2005 |
| KR | 10-2004-0032955 A | 4/2004 |
| KR | 10-2006-0065919 A | 6/2006 |
| KR | 10-0655082 B1 | 12/2006 |

* cited by examiner

*Primary Examiner* — Zandra Smith
*Assistant Examiner* — Christy L Novacek
(74) *Attorney, Agent, or Firm* — Lee & Morse, P.C.

(57) ABSTRACT

A method of forming a phase change memory device includes forming a core pattern on a substrate, conformally forming a heat conductive layer on the substrate including the core pattern, anisotropically etching the heat conductive layer down to a top surface of the core pattern to form a heat electrode surrounding a sidewall of the core pattern, and forming a phase change memory pattern connected to a top surface of the heat electrode.

10 Claims, 16 Drawing Sheets

PHASE CHANGE MEMORY DEVICES AND METHODS OF FORMING THE SAME

BACKGROUND OF THE INVENTION

1. Field of the Invention

Embodiments of the present invention relate to semiconductor memory devices and methods of forming the same. More particularly, embodiments of the present invention relate to phase change memory devices and methods of forming the phase change memory devices.

2. Description of the Related Art

Phase change memory devices are non-volatile memory devices, i.e., memory devices that retain stored data even when power supplies are interrupted. A unit cell of a phase change memory device may include a phase change material as an element for storing data.

The phase change material may have a different resistivity corresponding to each material state, i.e., phase. For example, a phase change material at an amorphous state may have a higher resistivity than the phase change material at a crystalline state. Accordingly, logic "1" data or logic "0" data may be stored in the phase change material using different resistivities according to the material state.

The phase change material may change to an amorphous state or to a crystalline state by controlling heat applied to the phase change material, e.g., heat in terms of temperature and/or duration. For example, a phase change material may change to an amorphous state from a crystalline state by applying heat corresponding to a melting point temperature of the material, followed by a quick cooling of the phase change material. Alternatively, the phase change material may change to a crystalline state from an amorphous state by applying heat corresponding to a crystallization temperature of the material, i.e., a temperature lower than a melting point temperature, followed by a slow cooling of the phase change material.

A conventional heat source of the phase change material may be, e.g., current applied to the phase change material, so temperature and duration of the heat applied to the phase change material may be controlled by adjusting an amount of the current. For example, the amount of current applied to the phase change material may be increased in order to increase temperature. An increase in the amount of current, however, may increase power consumption and decrease an integration degree of the conventional phase change memory device.

SUMMARY OF THE INVENTION

Embodiments of the present invention are therefore directed to phase change memory devices and methods of forming the same, which substantially overcome one or more of the disadvantages and shortcomings of the related art.

It is therefore a feature of exemplary embodiments to provide phase change memory devices with minimized current amounts through core patterns thereof.

It is another feature of exemplary embodiments to provide methods of forming phase change memory devices with minimized current amounts through core patterns thereof.

At least one of the above and other features and advantages of the present invention may be realized by providing a method of forming a phase change memory device, including forming a core pattern on a substrate, conformally forming a heat conductive layer on the substrate including the core pattern, anisotropically etching the heat conductive layer down to a top surface of the core pattern to form a heat electrode surrounding a sidewall of the core pattern, and forming a phase change memory pattern connected to a top surface of the heat electrode.

The method may further include a basis electrode surrounding a lower sidewall of the core pattern, wherein the heat electrode may surround an upper sidewall of the core pattern and is connected to a top surface of the basis electrode. A top surface of the heat electrode may be narrower than the top surface of the basis electrode. The basis electrode may surround the lower sidewall of the core pattern and a bottom surface of the core pattern. Forming the core pattern and the basis electrode may include forming a mold insulating layer including an opening on the substrate, sequentially forming a basis conductive layer and a core insulating layer on the substrate including the opening, planarizing the core insulating layer and the basis conductive layer down to a top surface of the mold insulating layer to form a preliminary basis electrode and a core pattern in the opening, removing an upper portion of the mold insulating layer to expose an upper portion of the preliminary basis electrode, and removing the upper portion of the preliminary basis electrode to form the basis electrode and to expose an upper portion of the core pattern. The removed upper portion of the mold insulating layer may include an insulating material having an etch selectivity with respect to a lower portion of the mold insulating layer remaining on the substrate. A bottom surface of the basis electrode and a bottom surface of the core pattern may be coplanar.

Forming the core pattern and the basis electrode may include forming a mold insulating layer including an opening on a substrate, conformally forming a basis conductive layer on the substrate, anisotropically etching back the basis conductive layer to form a preliminary basis electrode on a sidewall of the opening, forming a core pattern filling a space surrounded by the preliminary basis electrode in the opening, removing an upper portion of the mold insulating layer to expose an upper portion of the preliminary basis electrode, and removing the upper portion of the preliminary basis electrode to expose an upper portion of the core pattern. The removed upper portion of the mold insulating layer may include an insulating material having an etch selectivity with respect to a lower portion of the mold insulating layer remaining on the substrate. The method may further include forming an interlayer insulating layer which covers the heat electrode and the core pattern on an entire surface of the substrate, and planarizing the interlayer insulating layer down to a top surface of the heat electrode, wherein the phase change memory pattern is formed on the planarized interlayer insulating layer. Forming the phase change memory pattern may further include recessing the planarized interlayer insulating layer to protrude upper portions of the core pattern and the heat electrode, and planarizing the protruded upper portions of the core pattern and the heat electrode.

At least one of the above and other features and advantages of the present invention may be realized by providing a phase change memory device, including a core pattern disposed on a substrate, a basis electrode surrounding a lower sidewall of the core pattern, a heat electrode surrounding an upper sidewall of the core pattern and being connected to a top surface of the basis electrode, and a phase change memory pattern connected to a top surface of the heat electrode.

A top surface of the heat electrode may be narrower than the top surface of the basis electrode. A width of the heat electrode may be smaller than a width of the basis electrode. The heat electrode may have a pipe shape having an open top and an open bottom, and a top surface of the heat electrode has a closed loop shape. The core pattern may include an insulating material. The device may further include a mold insulating layer on the substrate and including an opening, the basis electrode being in the opening. The device may further include an interlayer insulating layer on the substrate and surrounding an outer sidewall of the heat electrode, wherein the phase change memory pattern is disposed on the interlayer insulating layer. The basis electrode may have a pipe shape having an open top and a closed bottom, the basis electrode surrounding a lower sidewall and a bottom surface of the core pattern, and a top surface of the basis electrode having a closed loop shape. The basis electrode may have a pipe shape having an open top and an open bottom, bottom surfaces of the basis electrode and the core pattern being coplanar, and a top surface of the basis electrode having a closed loop shape.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
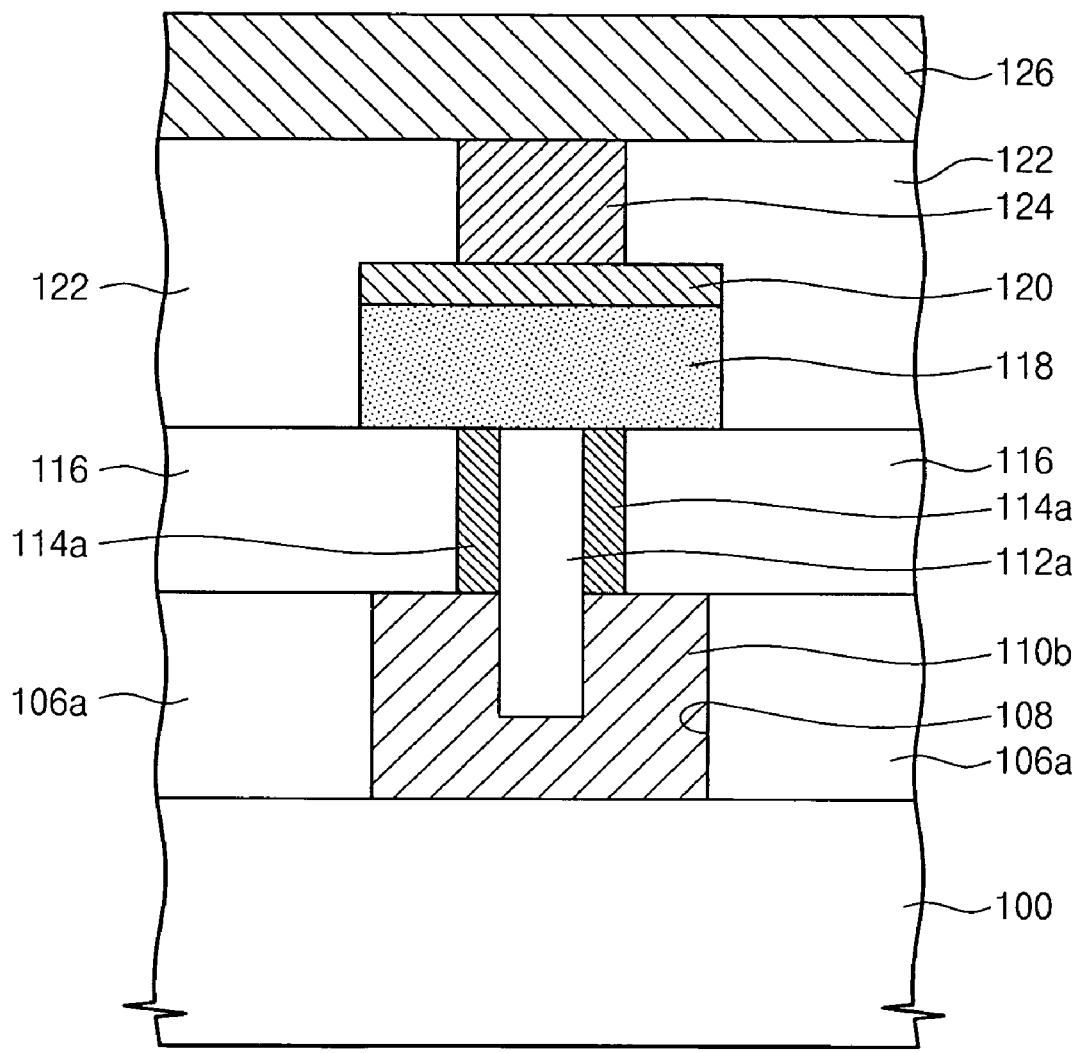
FIG. 1 illustrates a cross sectional view of a phase change memory device in accordance with an exemplary embodiment of the present invention.

Korean Patent Application No. 10-2007-0074619, filed on Jul. 25, 2007, in the Korean Intellectual Property Office, and entitled: "Phase Change Memory Devices and Methods of Forming the Same," is incorporated by reference herein in its entirety.

Exemplary embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element and/or layer is referred to as being "on" another element, layer and/or substrate, it can be directly on the other element, layer, and/or substrate, or intervening elements and/or layers may also be present. In addition, it will also be understood that when an element and/or layer is referred to as being "between" two elements and/or layers, it can be the only element and/or layer between the two elements and/or layers, or one or more intervening elements and/or layers may also be present. Further, it will be understood that when an element and/or layer is referred to as being "connected to" or "coupled to" another element and/or layer, it can be directly connected or coupled to the other element and/or layer, or intervening elements and/or layers may be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing exemplary embodiments only and is not intended to be limiting of the invention. As used herein, the singular forms "a", "an," and "the" are open terms that may be used in conjunction with singular items or with plural items.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, a "height" of a layer or an element is measured along a direction that is orthogonal to a surface of a substrate supporting the layer or element.

Hereinafter, a semiconductor device in accordance with some example embodiments of the present invention will be explained in detail with reference to the accompanying drawings.

Figure 2:
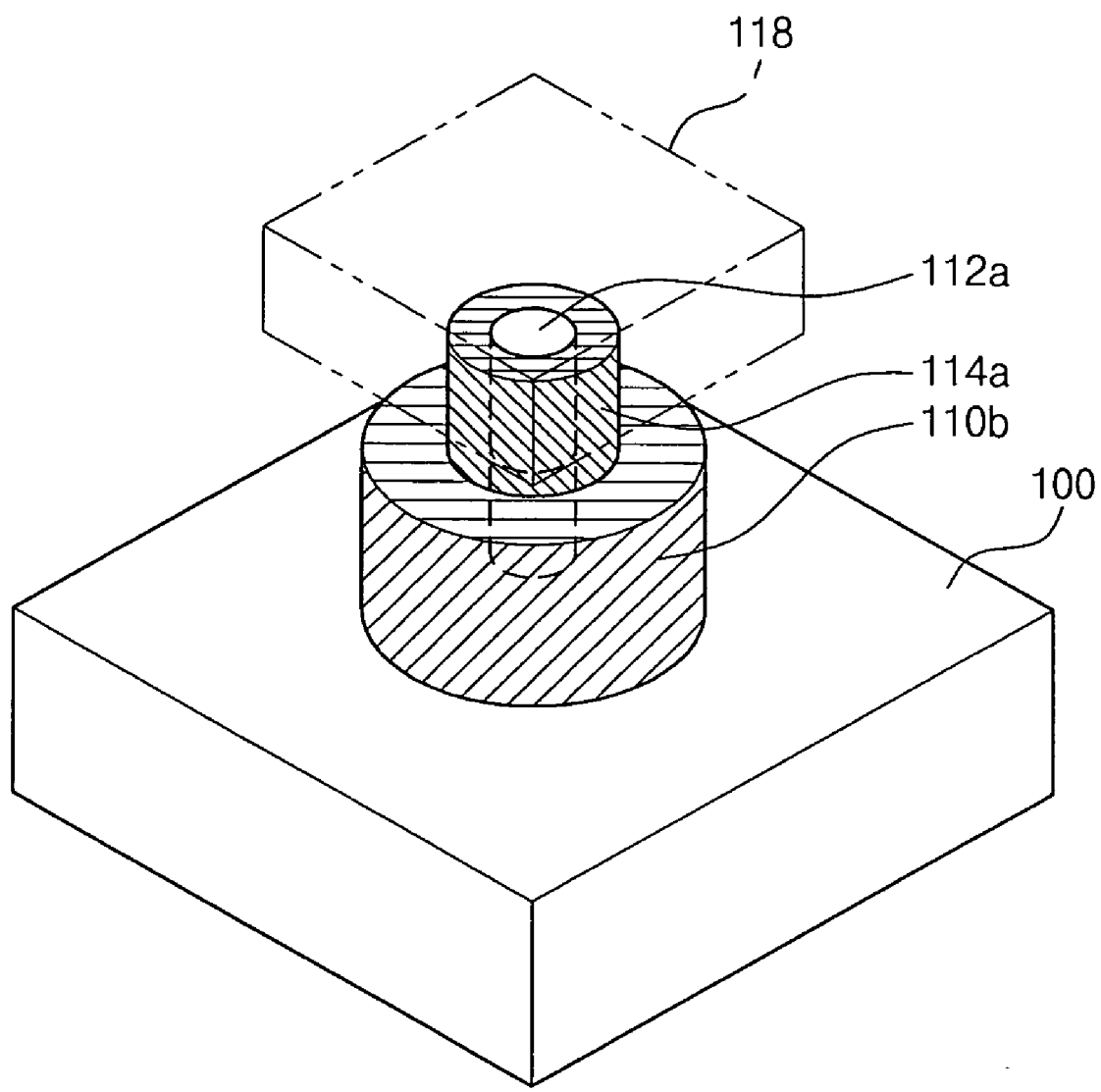
FIG. 2 illustrates a perspective view of a basis electrode, a heat electrode, and a phase change memory pattern in FIG. 1.

Referring to FIGS. 1-2, a phase change memory device may include a basis electrode 110b and a heat electrode 114a on a substrate 100, a core pattern 112 through the basis electrode 110b and the heat electrode 114a, and a phase change memory pattern 118 on the heat electrode 114a.

The substrate 100 may be any suitable semiconductor substrate. The substrate 100 may include selective devices (not shown), e.g., a MOS transistor, a PN diode, and so forth, therein. A mold insulating layer 106a may be disposed on the substrate 100, and an opening 108 may be formed through the mold insulating layer 106a to expose an upper surface of the substrate 100. The mold insulating layer 106a may include one or more of an oxide, a nitride, a carbide, an oxynitride, a oxycarbide, and so forth.

The basis electrode 110b may be disposed in the opening 108. The basis electrode 110b may be electrically connected to a terminal of the selective device. For example, if the selective device is a MOS transistor, the basis electrode 110b may be electrically connected to source/drain regions of the MOS transistor. In another example, if the selective device is a PN diode, the basis electrode 110b may be electrically connected to a terminal of the PN diode. A conductive landing pad (not shown) and/or a conductive plug (not shown) may be disposed between the basis electrode 110b and the terminal of the selective device.

As illustrated in FIG. 1, the basis electrode 110b may have an inner opening. In other words, the basis electrode 110b may include a bottom portion on a lower surface of the opening 108 and wall portions along lateral surfaces, i.e., sidewalls, of the opening 108, so the wall portion of the basis electrode 110b may extend from the bottom portion of the basis electrode 110b in an upward direction along the sidewalls of the opening 108. For example, the basis electrode 110b may be disposed conformally along the lower surface and the sidewall of the opening 108 to form the inner opening, and an upper surface of the basis electrode 110b may be substantially level with an upper surface of the mold insulating layer 106a. The term "conformally" corresponds to a layer formed with a uniform thickness or substantially uniform thickness along a profile of an underlying layer or structure.

For example, as illustrated in FIGS. 1-2, the basis electrode 110b may have a pipe shaped configuration, e.g., a cylindrical structure, having an open top and a closed bottom, e.g., a cross-section of an inverted—π the Greek letter "pi") along a plane orthogonal to the substrate 100. A cross-section of an upper surface of the basis electrode 110b, i.e., a surface facing away from the substrate 100 and including the inner opening, along a plane parallel to the substrate 100 may have a closed loop shape, e.g., a circular ring cross section. Accordingly, a surface area of the upper surface of the basis electrode 110b may be a surface area of the closed loop shape, i.e., an area calculated as a difference between surface areas of outer and inner loops defining the loop shape. The inner opening of the basis electrode 110b may or may not be concentric with the opening 108.

The core pattern 112a may be disposed on the substrate 100. The core pattern 112a may have a pole-shaped configuration, e.g., a linear rod, and may extend vertically in an upward direction with respect to the upper surface of the substrate 100. A lower portion of the core pattern 112a may be disposed in the opening 108, i.e., in the inner opening of the basis electrode 110b, so the basis electrode 110b may surround the lower portion of the core pattern 112a. In other words, the basis electrode 110b may surround a lower surface and lower portions of sidewalls of the core pattern 112a, so an upper portion of the core pattern 112a may protrude above, i.e., in an upward direction, the upper surface of the basis electrode 110b. The lower portion of the core pattern 112a may completely fill the inner opening in the basis electrode 110b, i.e., a pipe-shaped space defined by the bottom and wall portions of the basis electrode 110b. The core pattern 112a may be formed of an insulating material, e.g., one or more of an oxide, a nitride, a carbide, an oxynitride, an oxycarbide, and so forth. For example, if the core pattern 112a includes nitride, the core pattern 112a may have superior gap fill characteristic in the opening of the basis electrode 110b.

The heat electrode 114a may be on the basis electrode 110b, and may surround a sidewall of the upper portion of the core pattern 112a, i.e., a portion protruding above the upper surface of the basis electrode 110b. The heat electrode 114a may be connected to the upper surface of the basis electrode 110b, and may have a pipe shaped configuration having a uniform thickness. For example, the heat electrode 114a may have a pipe shaped configuration having an open top and an open bottom, so both upper and lower surfaces of the heat electrode 114a may have closed loop shaped cross section, e.g., ring-shaped cross-sections in a plane parallel to the substrate 100. An inner space inside the heat electrode 114a defined by inner sidewalls of the heat electrode 114 may be completely filled with the upper portion of the core pattern 112a. An upper surface of the heat electrode 114a and an upper surface of the core pattern 112a may be coplanar. An interlayer insulating layer 116 may be disposed on the upper surface of the mold insulating layer 106a, and may surround the heat electrode 114a. Upper surfaces of the interlayer insulating layer 116, heat electrode 114a, and core pattern 112a may be coplanar. The interlayer insulating layer 116 may include an oxide layer.

Each of the upper and lower surfaces of the heat electrode 114a may have a surface are smaller than the surface are of the upper surface of the basis electrode 110b. A width of the heat electrode 114 may be smaller than a width of the basis electrode 110b. A width the basis electrode 110b may be measured as a width of the opening 108 along a horizontal axis, i.e., an axis along a plane parallel to a plane of the substrate 100. A width of the heat electrode 114a may be measured as a distance along the horizontal axis between opposite outer lateral surfaces, i.e., sidewalls, of the heat electrode 114a. It is noted that the heat electrode 114a may include the inner sidewalls adjacent to the core pattern 112a, e.g., in direct contact with the core pattern 112a, and the outer sidewall surrounding the inner sidewall. In other words, the width of the heat electrode 114a may be measured as a horizontal distance between facing lateral surfaces of adjacent portions of the interlayer insulating layer 116.

The phase change memory pattern 118 may be disposed on the interlayer insulating layer 116. The phase change memory pattern 118 may be connected to the upper surface of the heat electrode 114a, e.g., the phase change memory pattern 118 may be in direct contact with the upper surface of the heat electrode 114a. The phase change memory pattern 118 may be formed of a phase change material that may exhibit different resistivity values with respect to a change of a phase of the material. For example, the phase change memory pattern 118 may be formed of a compound including at least one chalcogen, e.g., tellurium (Te) and/or selenium (Se), and at least one of gallium (Ge), antimony (Sb), bismuth (Bi), lead (Pb), tin (Sn), silver (Ag), arsenic (As), sulfur (S), silicon (Si), phosphorous (P), oxygen (O), and nitrogen (N). Examples of materials used to form the phase change memory pattern 118 may include one or more of Ge—Sb—Te, As—Sb—Te, As—Ge—Sb—Te, Sn—Sb—Te, Ag—In—Sb—Te, In—Sb—Te, 5A family element-Sb—Te, 6A family element-Sb—Te, 5A family element-Sb—Se, and 6A family element-Sb—Se.

A capping electrode 120 may be disposed on the phase change memory pattern 118. The capping electrode 120 may have a sidewall aligned with a sidewall of the phase change memory pattern 118, so the capping electrode 120 and the phase change memory pattern 118 may completely overlap one another. An upper interlayer insulating layer 122 may cover the interlayer insulating layer 116, the phase change memory pattern 118, and the capping electrode 120. The upper interlayer insulating layer 122 may include oxide. An interconnection plug 124 may penetrate the upper interlayer insulating layer 122, and may be connected to the capping electrode 120. An interconnection 126 may be disposed on the upper interlayer insulating layer 122, and may be connected to the interconnection plug 124. The interconnection 126 may be electrically connected to the phase change memory pattern 118 through the capping electrode 120. The interconnection 126 may correspond to a bit line, and the selective device on the substrate 100 may be electrically connected to a word line. Alternatively, the interconnection 126 may correspond to a word line, and the selective device may be electrically connected to the bit line.

According to embodiments of the present invention, the heat electrode 114a may have a pipe shaped configuration with open top and bottom surfaces that surround the sidewalls of the core pattern 112a formed of an insulating material. Accordingly, since a cross section of the upper surface of the heat electrode 114a is of a closed loop, a surface area of the upper surface of the heat electrode 114a may be decreased. Further, since the phase change memory pattern 118 may be in contact with the heat electrode 114a via the upper surface thereof, i.e., a surface having a cross section of a closed loop in a plane parallel to the substrate 100, a contact area between the phase change memory pattern 118 and the heat electrode 114a may be substantially minimized. Therefore, an amount of operating current through the heat electrode 114a employed for controlling heat applied to the phase change memory pattern 118 for changing a phase state thereof may be minimized. Even though the operating current through the minimized contact surface between the heat electrode 114a and the phase change memory pattern 118 is reduced, the top plan areas of unit devices, e.g., selective devices and/or MOS transistors in a peripheral circuit, may control the amount of the operating current decrease by reducing the operating current, so sufficient heat, i.e., heat at a sufficient temperature and/or duration, may be supplied to the phase change memory pattern 118 to change a state of the phase change pattern 118. Accordingly, a phase change memory device that has substantially reduced power consumption and/or a high integration degree may be embodied.

Also, since the heat electrode 114a is connected to the basis electrode 110b that has wider lower and upper surfaces than the heat electrode 114a, the basis electrode 110b may have a lower resistance than the heat electrode 114a. Therefore, a resistance between the heat electrode 114a and the selective devices on the substrate 100 may be reduced due to the basis electrode 110b therebetween. As a result, an operational speed of the phase change memory device may be improved.

Additionally, since the lower portion of the core pattern 112a is surrounded by the basis electrode 110b, even though the core pattern 112a may have a very small width, e.g., several to several tens of nanometers, the core pattern 112a may be sufficiently supported by the basis electrode 110b. As a result, a phase change memory device of a high reproducibility may be embodied. It is further noted that if a width of the opening 108 corresponds to a minimum line width as defined by a photolithography process, the core pattern 112a and a width of an upper portion of the heat electrode 114a may be embodied in a smaller size than the minimum line width. As a result, a contact area between the phase change memory pattern 118 and the heat electrode 114a may be decreased further.

The basis electrode 110b and the heat electrode 114a may be formed of a conductive material. The heat electrode 114a may be formed of a conductive material having a resistivity different than a resistivity of the basis electrode 110b. The basis electrode 110b may have a lower resistivity than the heat electrode 114a, so a resistivity of the basis electrode 110b electrically connected to the selective devices may be decreased, while a resistivity of the heat electrode 114a electrically connected to the phase change memory pattern 118 may be increased. Thus, the amount of an operational current may be reduced and an operational speed of the phase change memory device may be improved. Other configurations of the basis electrode 110b with respect to the heat electrode 114a, however, are within the scope of the present invention, e.g., the heat electrode 114a may have the same resistivity as the basis electrode 110b, the heat electrode 114a may have a lower resistivity than the basis electrode 110b, the heat electrode 114a may include a substantially same material as the basis electrode 110b, the heat electrode 114a may be formed of a different material than the basis electrode 110b, and so forth.

The basis electrode 110b may include at least one of a doped semiconductor, a conductive metallic nitride, a metal, and metal silicide. For example, the basis electrode 110b may include one or more of a doped silicon, a doped germanium, a doped silicon-germanium, tungsten (W), molybdenum (Mo), titanium (Ti), tantalum (Ta), titanium nitride (TiN), hafnium nitride (HfN), vanadium nitride (VN), niobium nitride (NbN), tantalum nitride (TaN), tungsten nitride (WN), molybdenum nitride (MoN), titanium aluminum nitride (TiAlN), titanium silicon nitride (TiSiN), titanium carbonitride (TiCN), tantalum silicon nitride (TaSiN), titanium boronitride (TiBN), zirconium silicon nitride (ZrSiN), tungsten silicon nitride (WSiN), tungsten boronitride (WBN), zirconium aluminum nitride (ZrAlN), molybdenum silicon nitride (MoSiN), molybdenum aluminum nitride (MoAlN), tantalum aluminum nitride (TaAlN), titanium oxynitride (TiON), titanium aluminum oxynitride (TiAlON), tungsten oxynitride (WON), tantalum oxynitride (TaON), tungsten silicon (WSi), cobalt silicon (CoSi), nickel silicon (NiSi), and titanium silicon (TiSi). The heat electrode 114a may include at least one of a doped semiconductor and a conductive metallic nitride. For example, the heat electrode 114a may include one or more of a doped silicon, a doped germanium, a doped silicon-germanium, TiN, HfN, VN, NbN, TaN, WN, MoN, TiAlN, TiSiN, TiCN, TaSiN, TiBN, ZrSiN, WSiN, WBN, ZrAlN, MoSiN, MoAlN, TaAlN, TiON, TiAlON, WON, and TaON.

The capping electrode 120 may be formed of a conductive material that may not react well to the phase change memory pattern 118. For example, the capping electrode 120 may be formed of a conductive metallic nitride, e.g., TiN, HfN, VN, NbN, TaN, WN, MoN, TiAlN, TiSiN, TiCN, TaSiN, TiBN, ZrSiN, WSiN, WBN, ZrAlN, MoSiN, MoAlN, TaAlN, TiON, TiAlON, WON, or TaON. The interconnection plug 124 may include one or more of tungsten, copper and aluminum. The interconnection 126 may include tungsten, copper or aluminum.

The core pattern 112a may have a pole-shaped structure, e.g., a circular pillar shaped configuration. In this case, the basis electrode 110b may have a cylindrical inner opening having a closed bottom, so a shape of the core pattern 112a may correspond to the shape of and completely fill the inner opening the basis electrode 110b. The heat electrode 114a may have a cylindrically shaped opening therethrough with open bottom and top. The opening 108 may have a cylindrical hole shape. Upper surfaces of the basis electrode 110b and the heat electrode 114a may have ring shapes. Alternatively, the core pattern may have different shapes, e.g., a polygon or an elliptical pillar structure, so the basis electrode and the heat electrode may have, e.g., a polygonal or an elliptical cross section to surround the core pattern.

Figure 3:
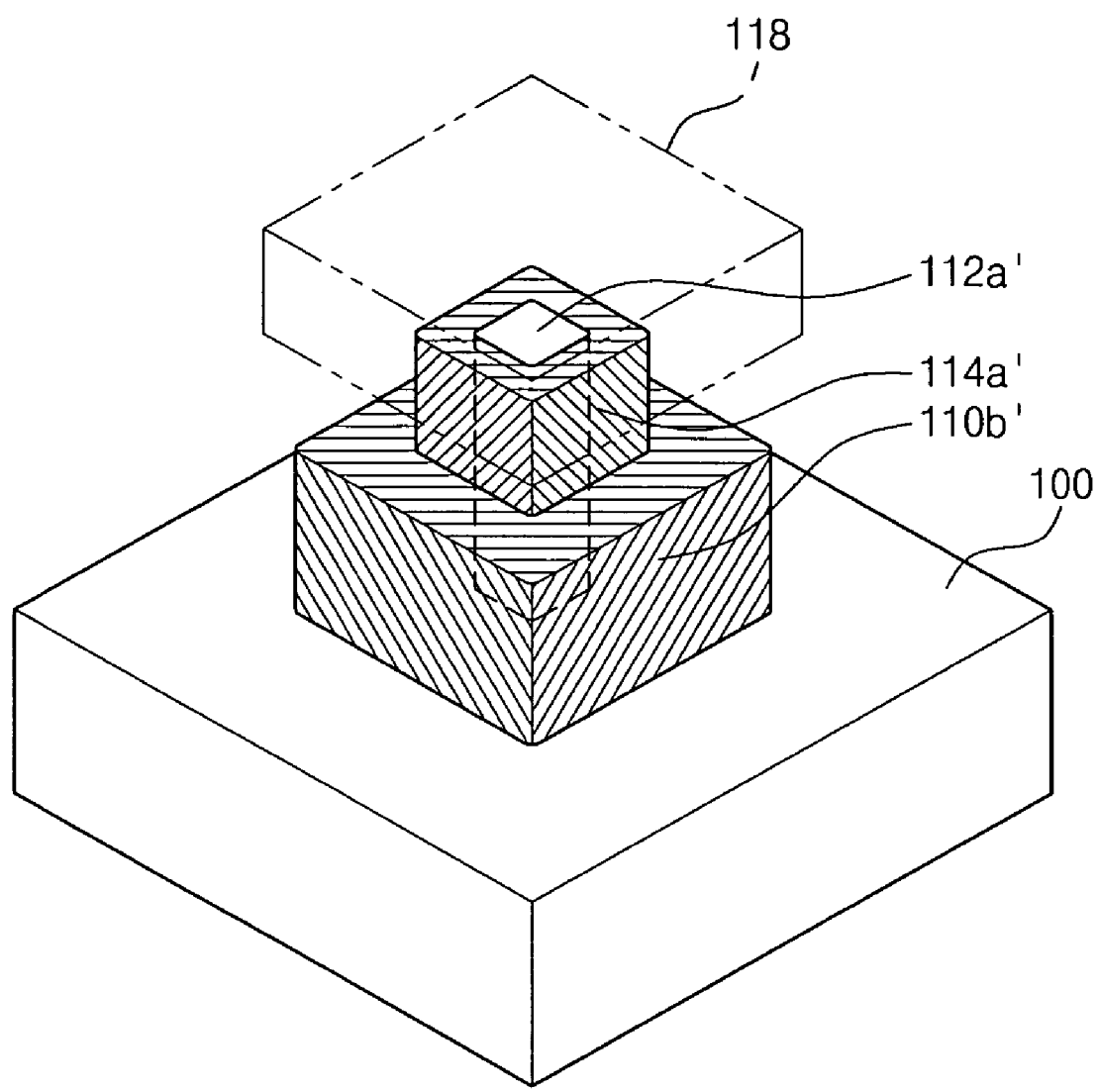
FIG. 3 illustrates a perspective view of a basis electrode, a heat electrode, and a phase change memory pattern in a phase change memory device in accordance with another exemplary embodiment of the present invention.

For example, referring to FIG. 3, a phase change memory device may be substantially same as the phase change memory device described previously with reference to FIGS. 1-2, with the exception of having a core pattern 112a' with a quadrangular pillar shape, so a heat electrode 114a' and a basis electrode 110b' may have a quadrangular pipe shape. For example, the core pattern 112a' may have a square pillar shape, i.e., may have a square cross section in a plane parallel to the substrate 100. The heat electrode 114a' may have a square pipe shape with an open top and an open bottom, and may surround an upper portion of the core pattern 112a'. The heat electrode 114a' may have a square closed loop cross-section in a plane parallel to the substrate 100. The basis electrode 110b' may have a square pipe shape with a closed bottom and an open top, and may surround a lower portion of the core pattern 112a'. An opening (not shown) penetrating the mold insulating layer 106a may have a square hole shape. An upper surface of the basis electrode 110b' may have a square closed loop shape. An area of the upper surface of the heat electrode 114a' may be less than an area of the upper surface of the basis electrode 110b'.

Figure 4:
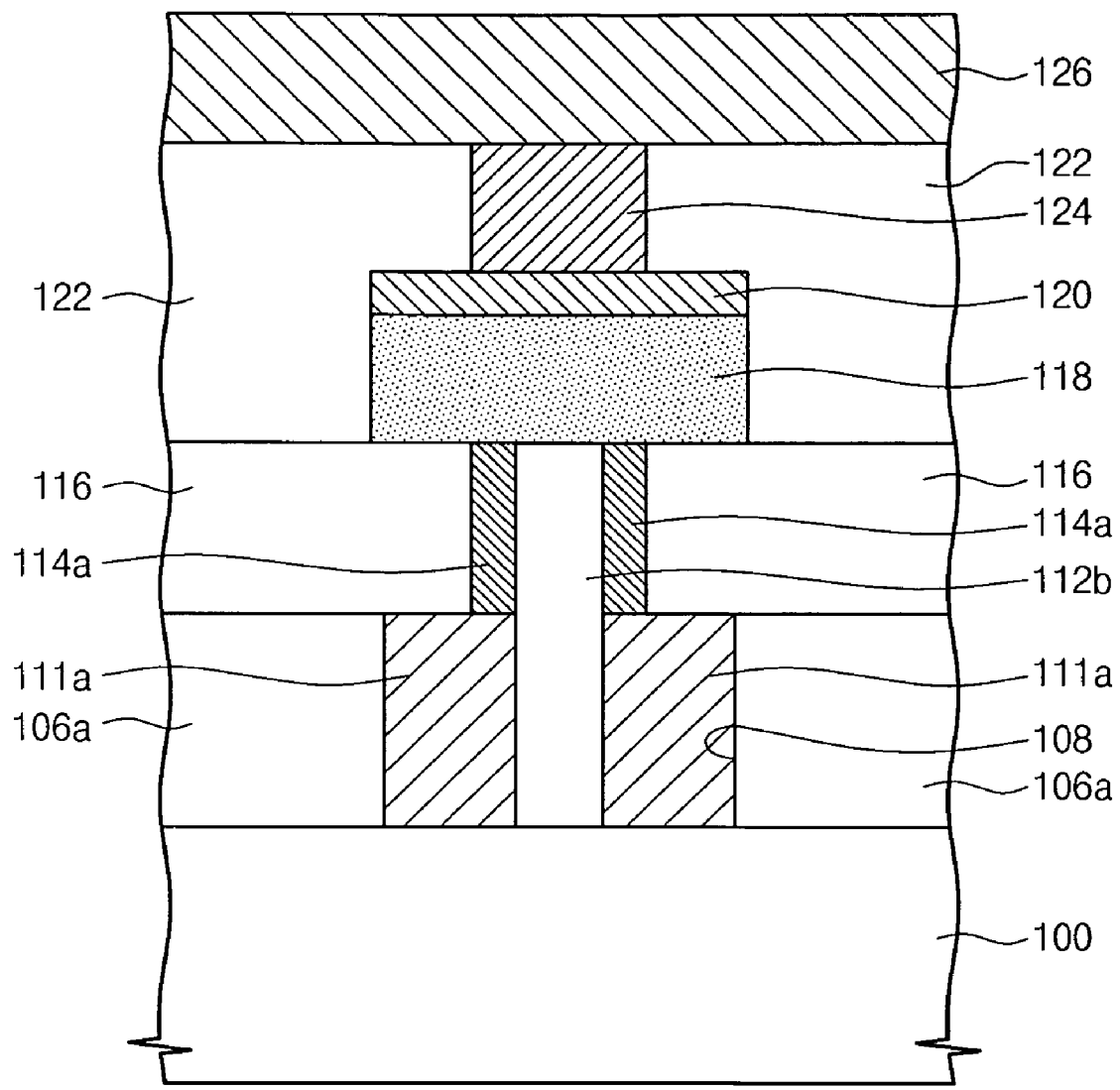
FIG. 4 illustrates a cross sectional view of a phase change memory device in accordance with another exemplary embodiment of the present invention.

According to another embodiment illustrated in FIG. 4, a phase change memory device may be substantially same as the phase change memory devices described previously with reference to FIGS. 1-3, with the exception of having a basis electrode 111a surrounding a core pattern 112b on the substrate 100. In particular, the basis electrode 111a may have only sidewall portions, i.e., without a bottom portion, disposed in the opening 108 of the mold insulating layer 106a, so a lower portion of the core pattern 112b may be disposed between sidewall portions of the basis electrode 111a to directly contact a bottom of the opening 108. The core pattern 112b may extend from the upper surface of the substrate 100 to the upper surface of the interlayer insulating layer 116, and the basis electrode 111a may surround a lower sidewall of the core pattern 112b, i.e., a portion between the upper surface of the substrate 100 and the upper surface of the mold insulating layer 106a. In other words, the basis electrode 111a may have a pipe shape having an open top and an open bottom, so a lower surface of the core pattern 112b and a lower surface of the basis electrode 111a may be coplanar, i.e., the lower surfaces of the core pattern 112b and the basis electrode 111a may be disposed at a substantially same height relatively to a common reference point.

The basis electrode 111a may extend upward along a sidewall of the opening 108, and may have a substantially uniform thickness, i.e., a distance as measured from a sidewall of the core pattern 112b to an immediately adjacent and facing sidewall of the opening 108. An upper surface of the basis electrode 111a may have a closed loop shape, e.g., a circular ring shape, an elliptical ring shape, a polygonal ring shape, and so forth. The core pattern 112b and the basis electrode 111a may be formed of substantially same materials as the core pattern 112a and the basis electrode 110b of FIGS. 1-2.

Figure 7:
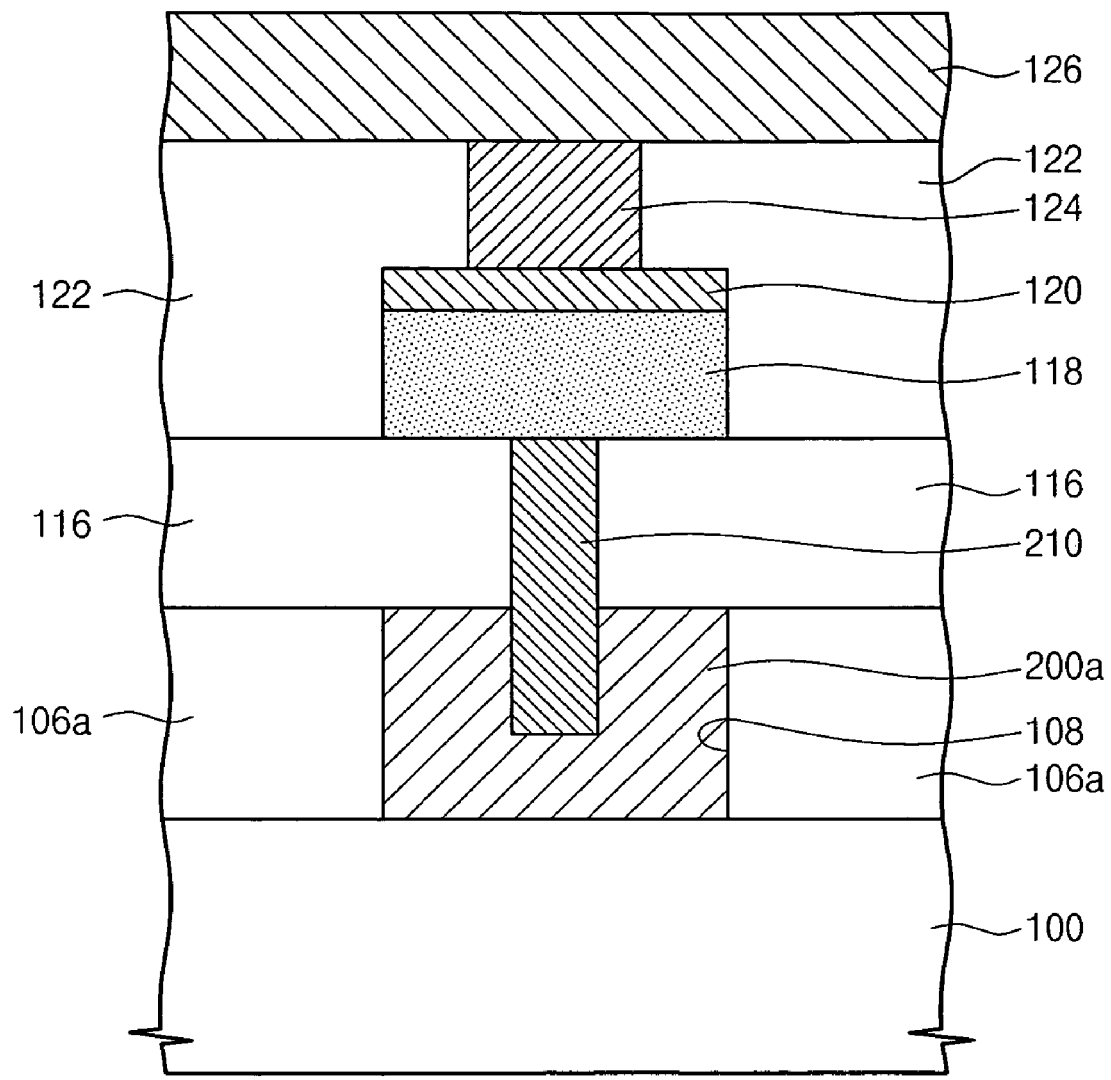
FIG. 7 illustrates a cross sectional view of a phase change memory device in accordance with another exemplary embodiment of the present invention.
Figure 8:
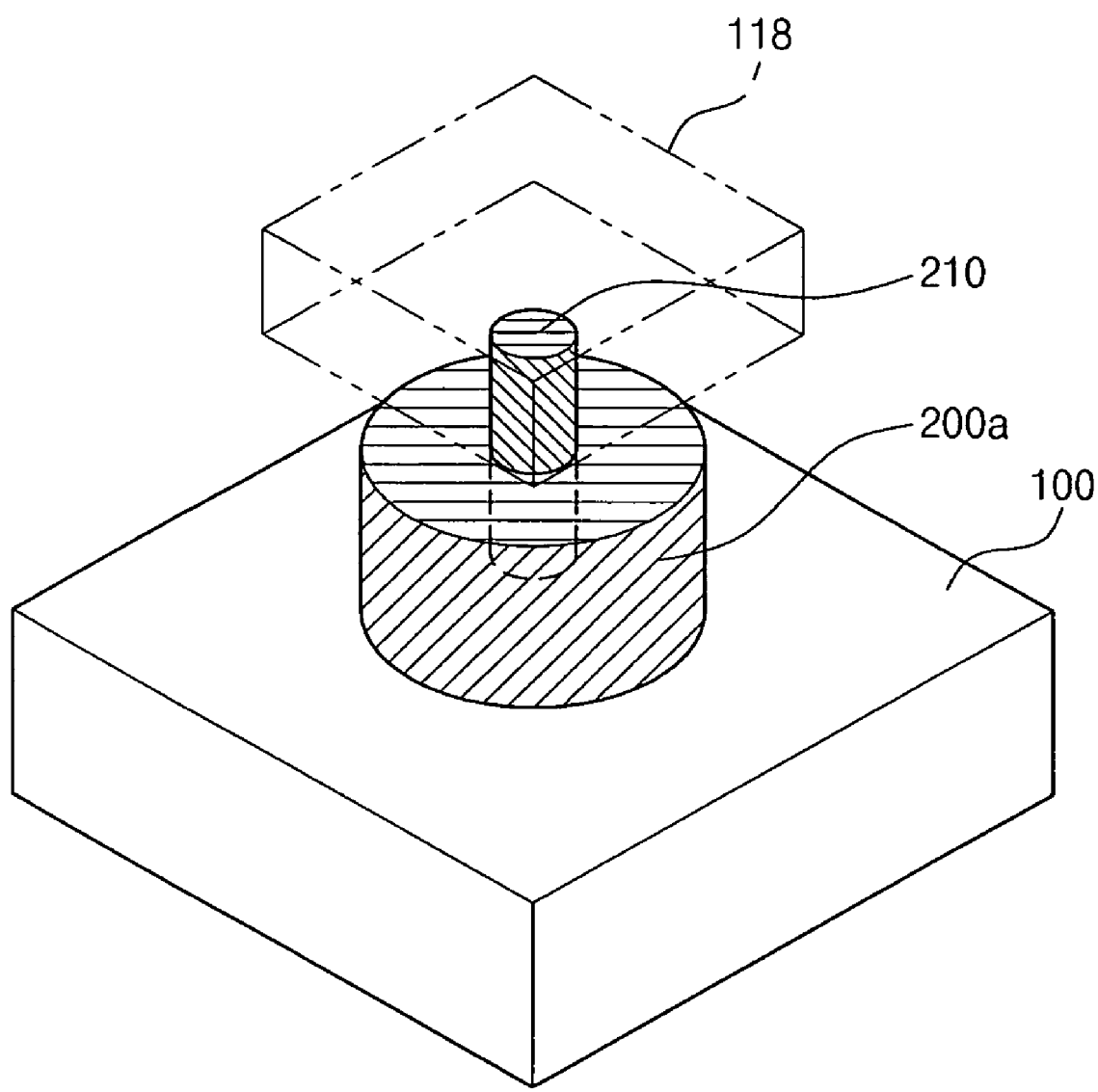
FIG. 8 illustrates a perspective view of a basis electrode, a heat electrode, and a phase change memory pattern in the phase change memory device of FIG. 7.

According to yet another embodiment, a phase change memory device may be substantially same as the phase change memory device described previously with reference to FIGS. 1-3, with the exception of having a different structure of a heat electrode. FIG. 7 illustrates a cross sectional view of a phase change memory device in accordance with some other exemplary embodiments of the present invention. FIG. 8 illustrates a perspective view of a basis electrode, a heat electrode, and a phase change memory pattern of FIG. 7.

Referring to FIGS. 7-8, a phase change memory device may include a basis electrode 200a on the substrate 100, a core pattern 210 through the basis electrode 200a, and the phase change memory pattern 118 on the core pattern 210. More specifically, the core pattern 210 may be formed of a conductive material, and may be used as a heat electrode.

The basis electrode 200a may be disposed in the opening 108 through the mold insulating layer 106a. A lower portion of the conductive core pattern 210 may be disposed in the opening 108 on the substrate 100, so the basis electrode 200a may surround the lower portion of the conductive core pattern 210. An upper portion of the core pattern 210 may protrude upward above an upper surface of the basis electrode 200a. Structural details of the basis electrode 200a and the conductive core pattern 210 may be substantially same as structural details of the basis electrode 110b and the core pattern 112a described previously with reference to FIGS. 1-3 and, therefore, will not be repeated.

An interlayer insulating layer 116 may be disposed on the mold insulating layer 106a, and may surround the upper portion of the conductive core pattern 210. For example, the interlayer insulating layer 116 and the conductive core pattern 210 may be in direct contact with each other. Upper surfaces of the interlayer insulating layer 116 and the conductive core pattern 210 may be coplanar.

A phase change memory pattern 118 may be disposed on the interlayer insulating layer 116, and may be in contact with the upper surface of the conductive core pattern 210, e.g., in direct contact with the upper surface of the conductive core pattern 210. The conductive core pattern 210 may correspond to a heat electrode, i.e., may be used as a heat electrode. The capping electrode 120 may be disposed on the phase change memory pattern 118, and the upper interlayer insulating layer 122 may cover the phase change memory pattern 118 and the capping electrode 120. The interconnection plug 124 may penetrate the upper interlayer insulating layer 122, and may be connected to the capping electrode 120. The interconnection 126 may be disposed on the upper interlayer insulating layer 122, and may be connected to the interconnection plug 124.

A width of the conductive core pattern 210 may be very small as compared with the opening 108. Accordingly, a contact area between the conductive core pattern 210 and the phase change memory pattern 118 may be substantially minimized. If the opening 108 is formed to have a minimum line width as defined by a photolithography process, the conductive core pattern 210 may be formed to be very small as compared with the minimum line width. Since a lower portion of the conductive core pattern 210 may be surrounded by the basis electrode 200a, the basis electrode 200a may sufficiently support a lower portion of the conductive core pattern 210 to avoid collapse thereof even if the conductive core pattern 210 has a very small line width. Consequently, an amount of an operational current through the conductive core pattern 210 for changing a state of the phase change memory pattern 118 may be minimized due to the small line width of the conductive core pattern 210. Further, a contact resistance between the conductive core pattern 210 and the basis electrode 200a may be reduced. In addition, since the conductive core pattern 210 may be connected to the selective device through the basis electrode 200a, a resistance between the phase change memory pattern 118 and the selective device may be decreased. Therefore, a phase change memory device that has minimum power consumption and/or a high integration may be embodied.

The conductive core pattern 210 may be formed of a conductive material having an etch selectivity with respect to the basis electrode 200a. The conductive core pattern 210 may be formed of a conductive material different from the basis electrode 200a. The conductive core pattern 210 may be formed of a conductive material having a superior gap fill characteristic. The conductive core pattern 210 may be formed of a conductive material having a resistivity different from the basis electrode 200a. The conductive core pattern 210 may be formed of a conductive material having a resistivity higher than the basis electrode 200a. In some cases, the conductive core pattern 210 may be formed of a conductive material having the same resistivity as the basis electrode 200a or the conductive core pattern 210 may be formed of a conductive material having a resistivity lower than the basis electrode 200a.

The conductive core pattern 210 may be formed of a doped semiconductor or a conductive metallic nitride. For example, the conductive core pattern 210 may include at least one selected from the group consisting of a doped silicon, a doped germanium, a doped silicon-germanium, TiN, HfN, VN, NbN, TaN, WN, MoN, TiAlN, TiSiN, TiCN, TaSiN, TiBN, ZrSiN, WSiN, WBN, ZrAlN, MoSiN, MoAlN, TaAlN, TiON, TiAlON, WON, and TaON. The basis electrode 200a may include at least one selected from the group consisting of a doped silicon, a doped germanium, a doped silicon-germanium, W, Mo, Ti, Ta, TiN, HfN, VN, NbN, TaN, WN, MoN, TiAlN, TiSiN, TiCN, TaSiN, TiBN, ZrSiN, WSiN, WBN, ZrAlN, MoSiN, MoAlN, TaAlN, TiON, TiAlON, WON, TaON, WSi, CoSi, NiSi, and TiSi. Accordingly, the conductive core pattern 210 may be formed, e.g., of a doped semiconductor, and the basis electrode 200a may be formed, e.g., of a conductive metallic nitride.

Figure 9:
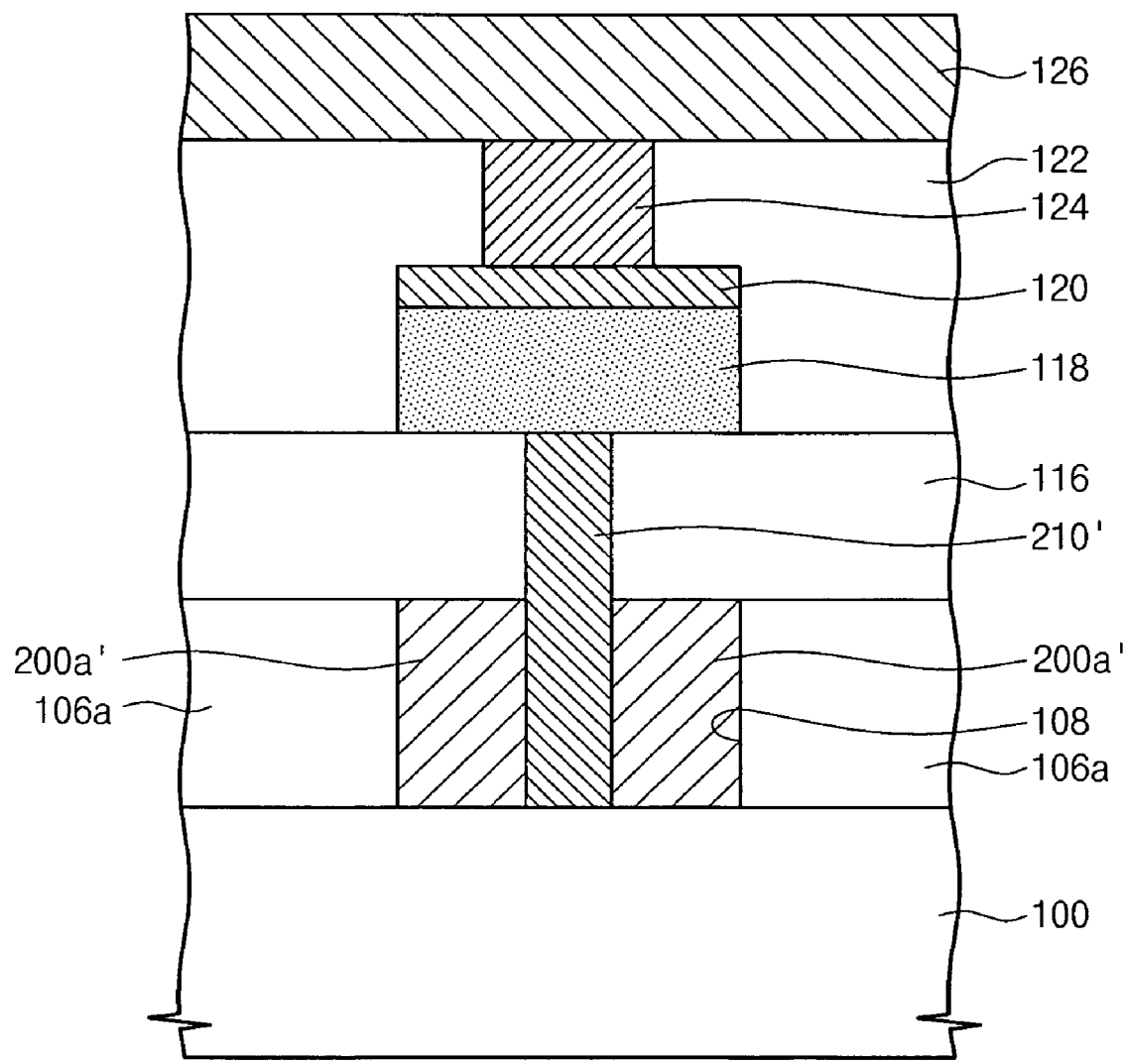
FIG. 9 illustrates a cross sectional view of a phase change memory device in accordance with another exemplary embodiment of the present invention.

According to another embodiment, as illustrated in FIG. 9, a phase change memory device may be substantially same as the phase change memory device of FIGS. 7-8, with the exception of having a conductive core pattern 210' penetrating through an entire basis electrode 200a', so lower surfaces of the conductive core pattern 210' and basis electrode 200a' may be substantially coplanar and in contact with a lower surface of the opening 108. The basis electrode 200a' may have a substantially same structure as the basis electrode 111a of FIG. 4. The conductive core pattern 210' and the basis electrode 200a' may be formed of substantially same materials as the conductive core pattern 210 and the basis electrode 200a of FIG. 7, respectively.

A method of forming the phase change memory device of FIGS. 1-3 will be described in more detail below. FIGS. 5A-5H illustrate cross sectional views of a method of forming a phase change memory device in accordance with some exemplary embodiments of the present invention.

Figure 5A:
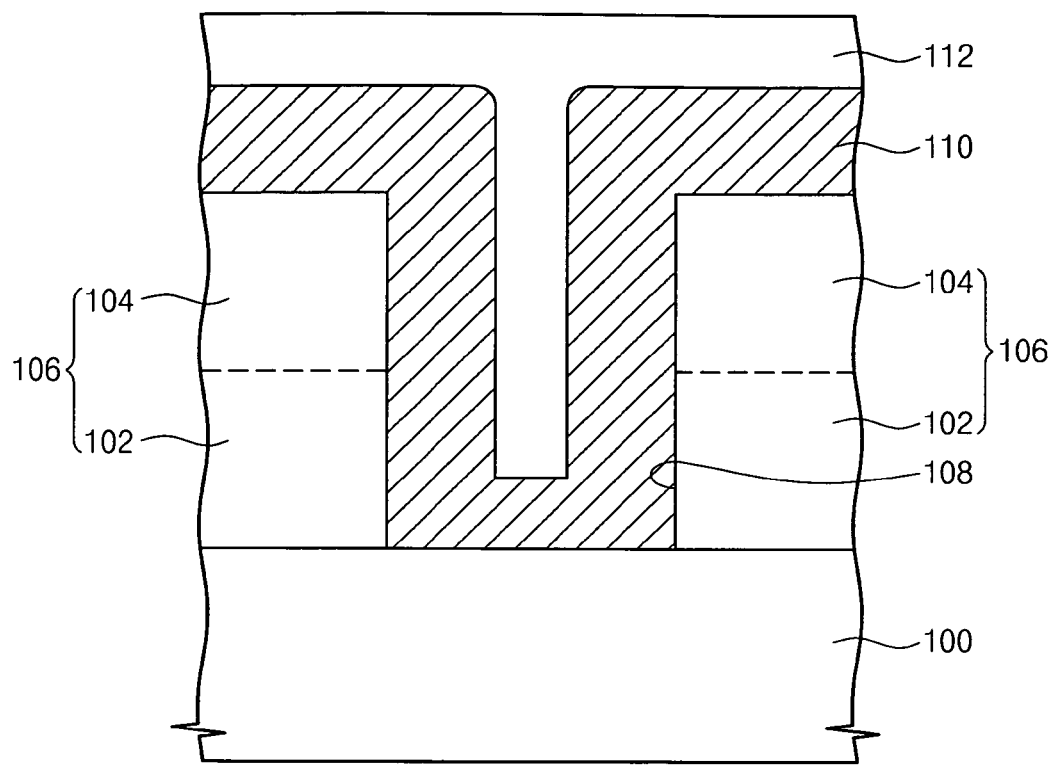
FIGS. 5A-5H illustrate cross sectional views of sequential stages in a method of forming the phase change memory device of FIGS. 1-3.

Referring to FIG. 5A, a mold insulating layer 106 may be formed on the substrate 100. As described above, the substrate 100 may include a semiconductor substrate and selective devices formed in the semiconductor substrate. The mold insulating layer 106 may be formed of at least one of oxide, nitride, carbide, oxynitride and oxycarbide. The mold insulating layer 106 may be formed of a single layer. Alternatively, the mold insulating layer 106 may be formed of multiple layers, e.g., a second layer 104 may be sequentially stacked on a first layer 102, as illustrated in FIG. 5A. If the mold insulating layer 106 is formed of multiple layers, the multiple layers may be formed of materials having etch selectivity with respect to each other, e.g., the first layer 102 may be formed of nitride and the second layer 104 may be formed of oxide.

The mold insulating layer 106 may be patterned to form an opening 108 therethrough to expose the upper surface of the substrate 100. The opening 108 may be formed to have any suitable shape. For example, the opening 108 may be formed to have a hole shape, e.g., a cylindrical hole shape, a polyhedral hole shape, and so forth, and a top of the opening 108, i.e., a cross section in a plane parallel to the substrate 100, may be, e.g., circular, elliptical, polygonal, and so forth.

A basis conductive layer 110 may be conformally formed on the substrate 100, e.g., on an upper surface of the mold insulating layer 106 and on inner surfaces of the opening 108. The basis conductive layer 110 may have a substantially uniform thickness along inner surfaces of the opening 108, i.e., a lower surface and sidewalls of the opening 108. The basis conductive layer 110 may be formed to fill a portion of the opening 108, so an inner space surrounded by the basis conductive layer 110 may be formed in the opening 108. A core insulating layer 112 may be formed on the basis conductive layer 110 to fill the inner space in the opening 108. The core insulating layer 112 may be formed of a material having an etch selectivity with respect to an upper portion of the mold insulating layer 106. For example, if the mold insulating layer 106 includes the first and second layers 102 and 104, the core insulating layer 112 may be formed of a material having an etch selectivity with respect to the second layer 104. In another example, if the mold insulating layer 106 is formed of a single layer, the core insulating layer 112 may be formed of a material having an etch selectivity with respect to the mold insulating layer 106. The core insulating layer 112 may be formed of an insulating material having a superior gap fill characteristic. The core insulating layer 112 may be formed of at least one of an oxide, a nitride, a carbide, an oxynitride, and an oxycarbide. For example, if the first layer 102 is formed of nitride and the second layer 104 is formed of oxide, the core insulating layer 112 may be formed of nitride having superior gap fill characteristics.

Figure 5B:
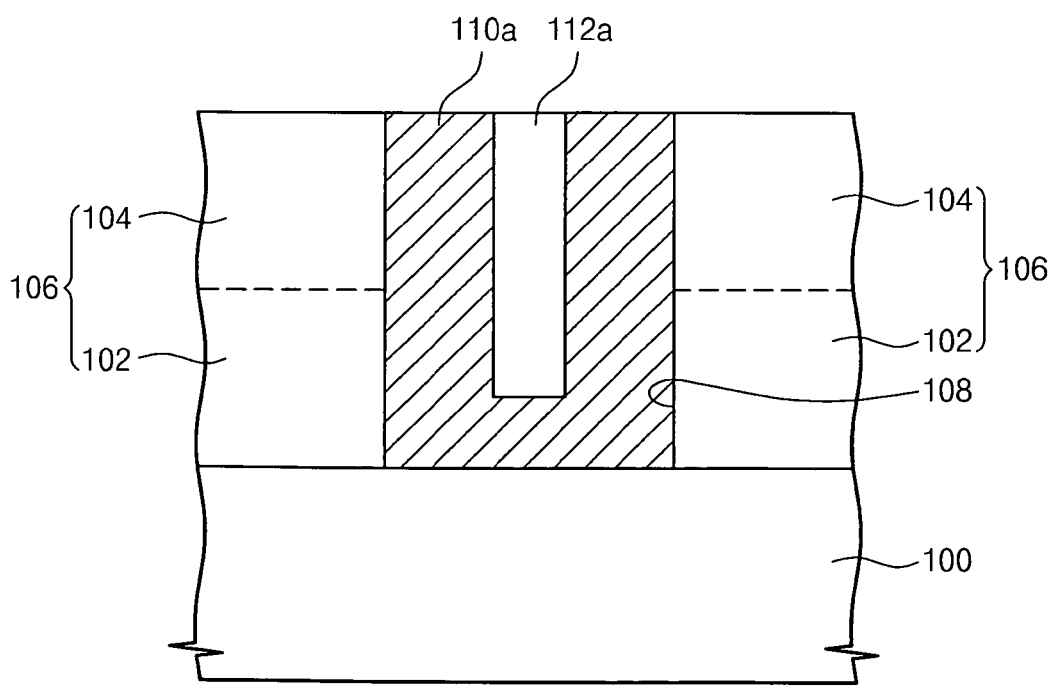

Referring to FIG. 5B, the core insulating layer 112 and the basis conductive layer 110 may be planarized to expose an upper surface of the mold insulating layer 106, so a preliminary basis electrode 110a and a core pattern 112a may be formed, respectively. The core insulating layer 112 and the basis conductive layer 110 may be planarized using, e.g., an anisotropic etching or a chemical mechanical polishing (CMP) process.

Figure 5C:
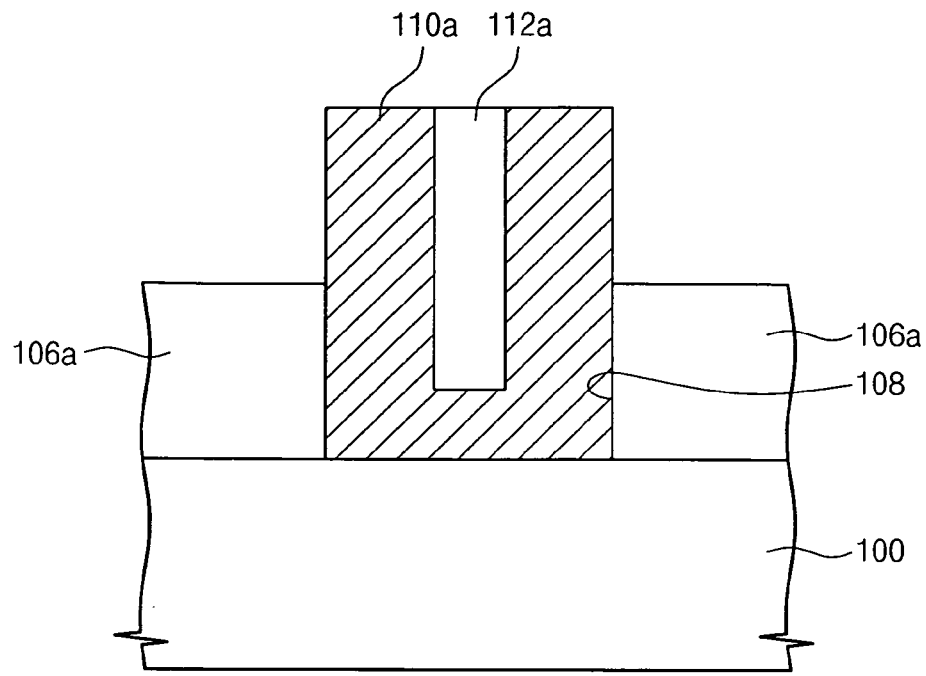

Referring to FIG. 5C, an upper portion of the mold insulating layer 106 may be removed to expose an upper sidewall of the preliminary basis electrode 110a, so a lower portion 106a may remain on the substrate 100 to surround a lower portion of the preliminary basis electrode 110a. For example, if the mold insulating layer 106 includes the first and second layers 102 and 104, the second layer 104 may be removed and the first layer 102 may remain on the substrate 100 to surround a lower portion of the preliminary basis electrode 110a. In other words, the lower portion 106a of the mold insulating layer 106a may include the first layer 102. The upper portion of the mold insulating layer 106 may be removed via, e.g., etching. Examples of etching may include an isotropic etching, e.g., a wet etching, an anisotropic etching, and so forth.

Figure 5D:
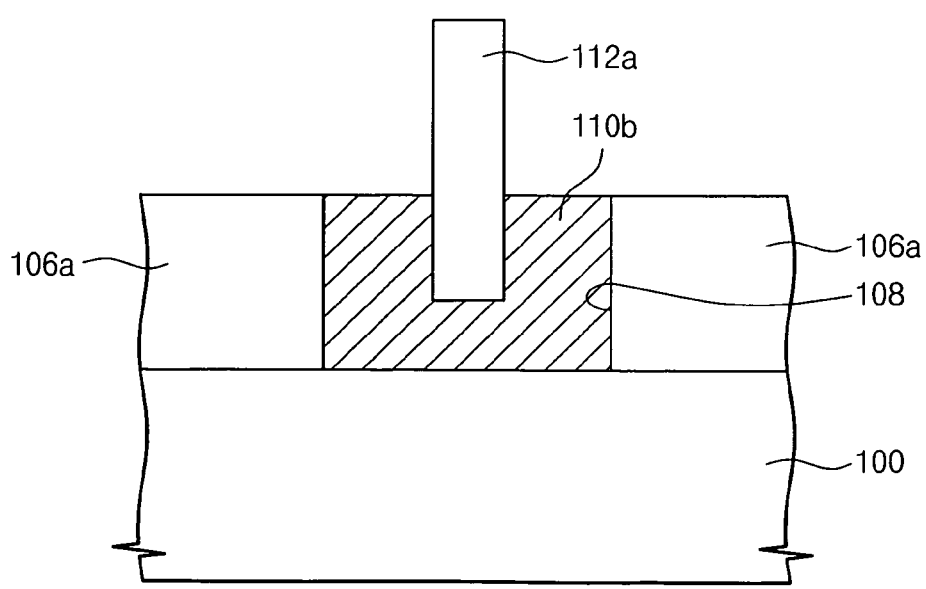

Referring to FIG. 5D, the exposed upper sidewall portions of the preliminary basis electrode 110a may be removed to form a basis electrode 110b and to expose an upper portion of the core pattern 112a. In other words, a lower portion of the preliminary basis electrode 110a may remain in the opening 108 of the mold insulating layer 106a to define the basis electrode 110b therein, and the exposed upper portion of the core pattern 112a may protrude upward above an upper surface of the basis electrode 110b. The upper surface of the basis electrode 110b may have a substantially same height as the upper surface of the mold insulating layer 106a, i.e., may be substantially coplanar, or may have a height lower than the upper surface of the mold insulating layer 106a, i.e., closer to the upper surface of the substrate 100 than the upper surface of the mold insulating layer 106a. Shapes of the basis electrode 110b and the core pattern 112a may correspond to a shape of the opening 108 as described previously with reference to FIGS. 1-3.

A width of the core pattern 112a may be very narrow. For example, if the opening 108 is formed to have a minimum line width as defined by a photolithography process, the width of the core pattern 112a may be formed to be smaller than the minimum line width. It is noted that even if the core pattern 112a is very narrow, a lower portion of the core pattern 112a may be supported by the basis electrode 110b to impart sufficient rigidity, i.e., the core pattern 112a may not fall down, and reproducibility to the core pattern 112a.

Figure 5E:
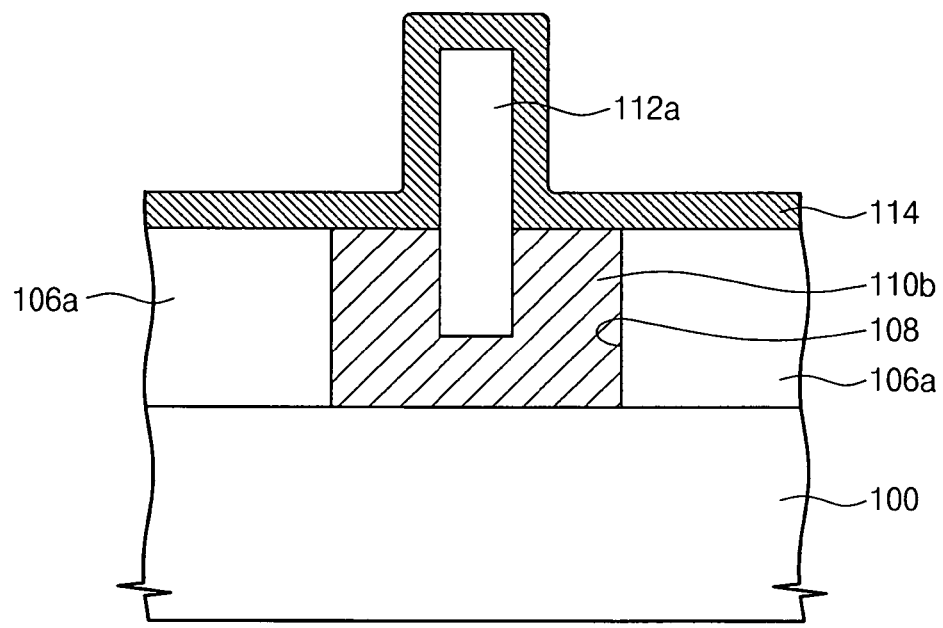

Referring to FIG. 5E, a heat conductive layer 114 may be conformally formed on the substrate 100 to cover the protruded upper portion of the core pattern 112a. The heat conductive layer 114 may be formed to have a substantially uniform thickness on sidewalls and on an upper surface of the core pattern 112a. The heat conductive layer 114 may be formed of a substantially same conductive material as the basis electrode 110b, of a conductive material having a different resistivity than the basis electrode 110b, e.g., the heat conductive layer 114 may be formed of a conductive material having a higher resistivity than the basis electrode 110b or of a conductive material having a lower resistivity than the basis electrode 110b, or of a different material and having a substantially same resistivity as the basis electrode 110b. The heat conductive layer 114 may be thinner than the basis conductive layer 110 in FIG. 5A.

Figure 5F:
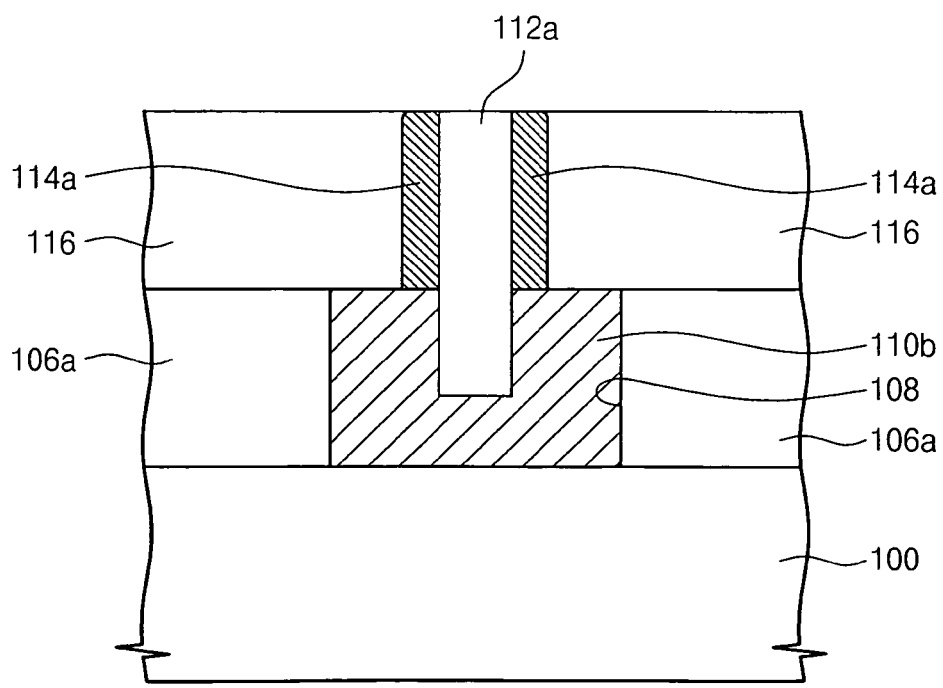

Referring to FIG. 5F, the heat conductive layer 114 may be anisotropically etched to expose upper surfaces of the core pattern 112a and the mold insulating layer 106a, so a heat electrode 114a may be formed to surround the protruded upper portion of the core pattern 112a. The heat electrode 114a may be formed to have a pipe shape having an open top and an open bottom. An upper cross-section of the heat electrode 114a may have a closed loop shape, e.g., a circular ring, an elliptical ring, or a polygonal ring. The heat conductive layer 114 may be formed to be thinner than the basis conductive layer 110, so the horizontal distance between an inner and a corresponding outer sidewall of the heat conductive layer 114 surrounding the core pattern 112a may be smaller than a corresponding distance in the basis conductive layer 110. Therefore, a surface area of an upper surface of the heat electrode 114a may be smaller than a surface area of an upper surface of the basis electrode 110b. Similarly, a width of the heat electrode 114a may be smaller than a width of the basis electrode 110b. A surface area of a lower surface of the heat electrode 114a may be smaller than a surface area of a lower surface of the basis electrode 110b Subsequently, an interlayer insulating layer may be formed on an entire surface of the substrate 100. The interlayer insulating layer may be planarized to expose the upper surface of the heat electrode 114a, and the planarized interlayer insulating layer 116 may surround an outer sidewall of the heat electrode 114a. The core pattern 112a may have an etch selectivity with respect to the planarized interlayer insulating layer 116. The upper surfaces of the planarized interlayer insulating layer 116, the core pattern 112a, and the heat electrode 114a may be coplanar, i.e., may form one planarized surface.

Figure 5G:
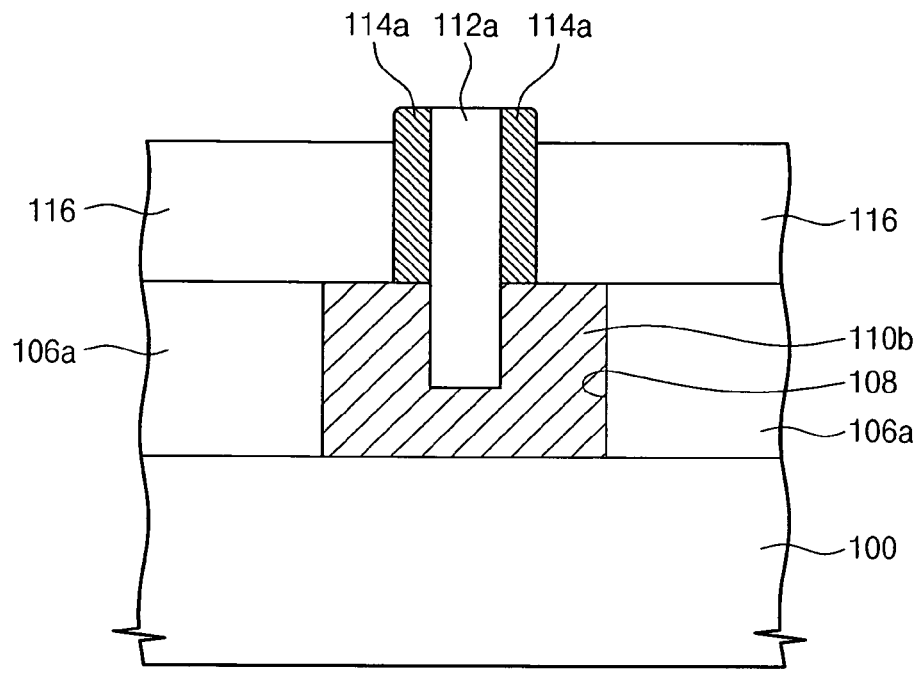

Referring to FIG. 5G, the planarized interlayer insulating layer 116 may be recessed, so upper portions of the heat electrode 114a and the core pattern 112a may protrude above an upper surface of the recessed interlayer insulating layer 116. The protruded heat electrode 114a and the core pattern 112a may be planarized using, e.g., a chemical mechanical polishing (CMP) process. As a result, upper surfaces of the planarized interlayer insulating layer 116, the core pattern 112a, and the heat electrode 114a may form one planarized surface. The upper surface of the heat electrode 114a may be planarized by a process of recessing the planarized interlayer insulating layer 116 and, subsequently, planarizing the protruded heat electrode 114a and the core pattern 112a. Therefore, an upper surface of the heat electrode 114a may be formed to have reproducibility. In addition, a height of the heat electrode 114a may be lowered. Since the heat electrode 114a and the basis electrode 110b may be connected to each other in series between the phase change memory pattern 118 and the selective device in the substrate 100, a lower height of the heat electrode 114a may decrease a length of a conducting wire of the heat electrode 114a, thereby reducing a resistance between the phase change memory pattern 118 and the selective device. As a result, a total resistance between the phase change memory pattern 118 and the selective device may be reduced to improve an operational speed of the phase change memory cell.

In the above description, the planarized interlayer insulating layer 116 may be first recessed to protrude the heat electrode 114a and the core pattern 112a, followed by planarizing the protruded heat electrode 114a and the core pattern 112a. Alternatively, an upper portion of the planarized interlayer insulating layer 116 and upper portions of the corresponding core pattern 112a and the heat electrode 114a may be planarized during formation of the planarized interlayer insulating layer 116, followed by additional polishing of the resultant upper surfaces. According to some exemplary embodiments, a process of recessing the planarized interlayer insulating layer 116 and a process of planarizing the upper portion of the heat electrode 114a may be omitted.

Figure 5H:
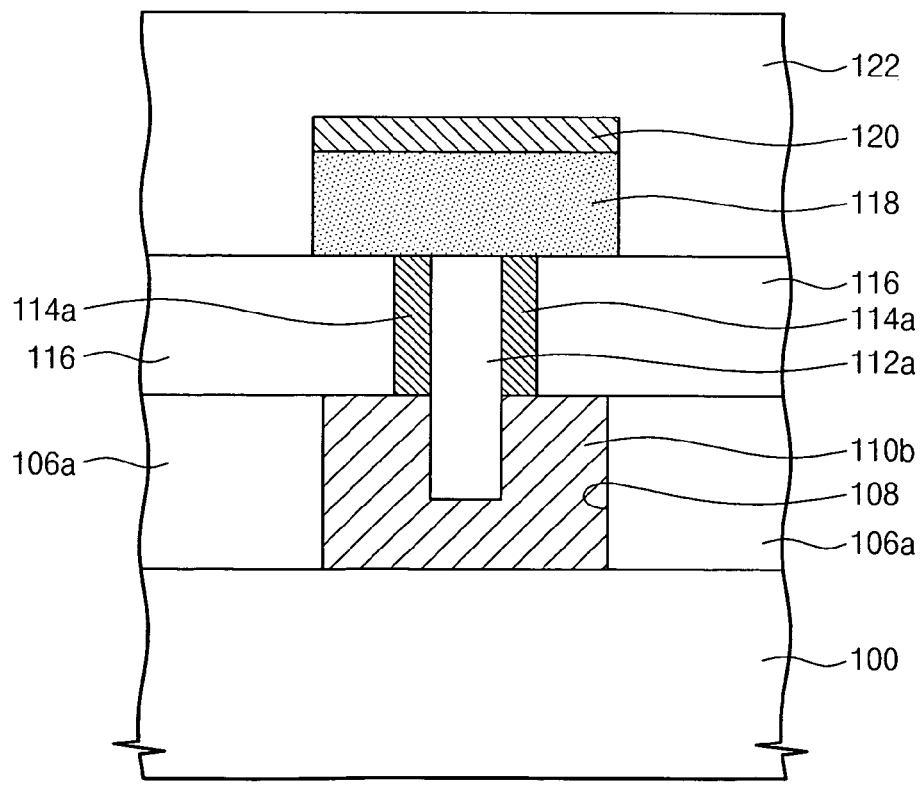

Referring to FIG. 5H, a phase change layer and a capping conductive layer may be sequentially formed on the interlayer insulating layer 116, followed by patterning of the capping conductive layer and the phase change layer to form a phase change memory pattern 118 and a capping electrode 120, respectively. An upper interlayer insulating layer 122 may be formed on an entire surface of the substrate 100 including the phase change memory pattern 118 and the capping electrode 120. Subsequently, an interconnection plug 124 of FIG. 1 may be formed to penetrate the interlayer insulating layer 122, and an interconnection 126 of FIG. 1 may be formed on the upper interlayer insulating layer 122 to finalize the phase change memory device.

Figure 6A:
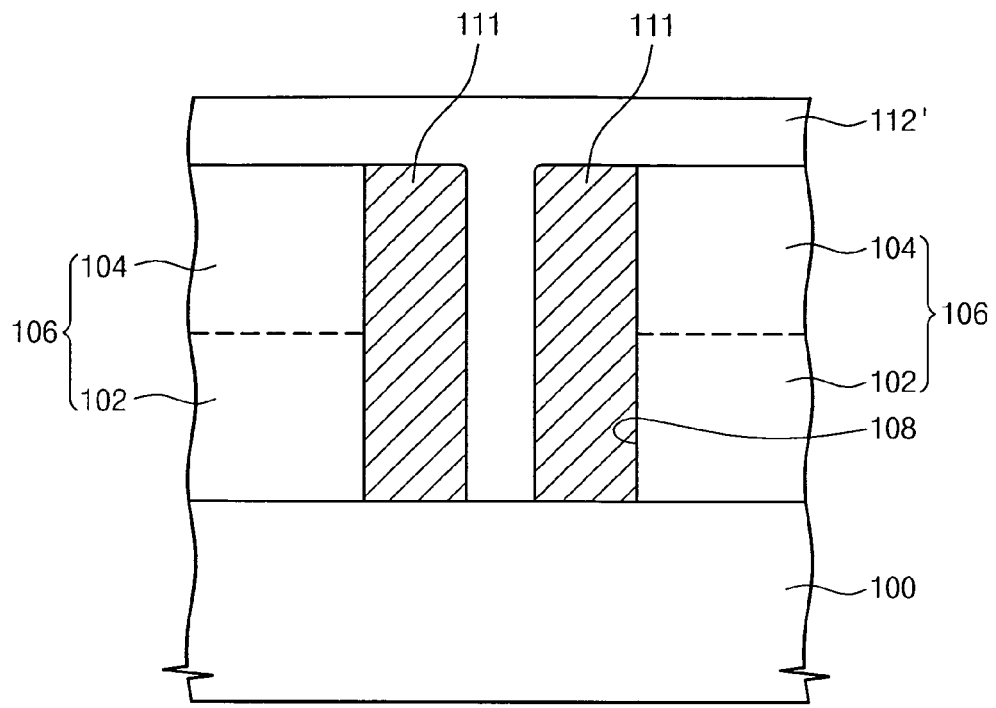
FIGS. 6A-6C illustrate cross sectional views of sequential stages in a method of forming the phase change memory device of FIG. 4.
Figure 6B:
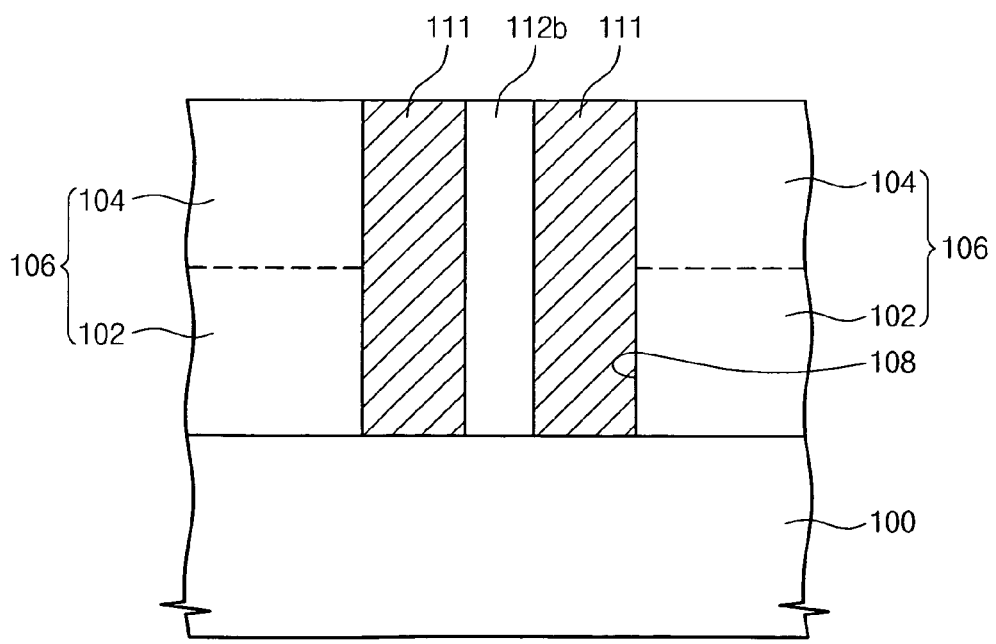
Figure 6C:
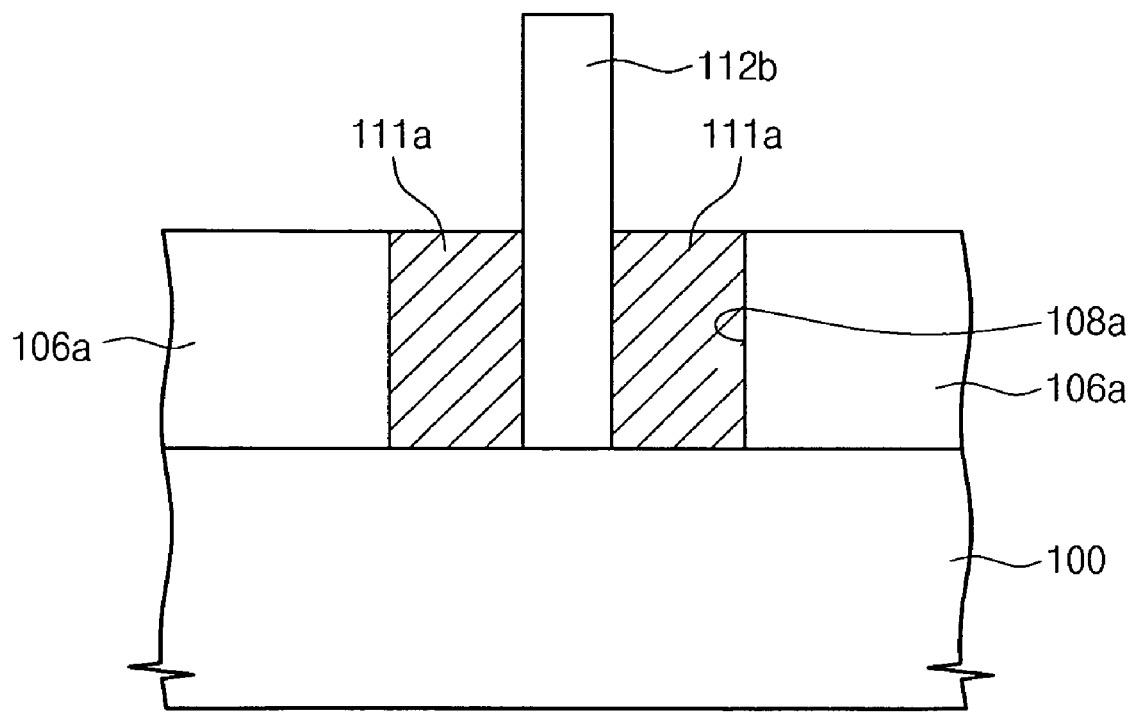

A method of forming the phase change memory device of FIG. 4 will be described in more detail below. FIGS. 6A-6C illustrate cross sectional views of an exemplary a method of forming the phase change memory device of FIG. 4.

Referring to FIG. 6A, a method of forming the mold insulating layer 106, the opening 108 therethrough, and the basis conductive layer 110 may be substantially same as described previously with reference to FIG. 5A and, therefore, will not be repeated. The basis conductive layer 110 may be anisotropically etched back to expose an upper surface of the substrate 100 to form a preliminary basis electrode 111. Thus, the preliminary basis electrode 111 may be formed on a sidewall of the opening 108, e.g., may have a spacer shape on the sidewall of the opening 108, and may define an inner space in the opening 108. A core insulating layer 112' may be formed on an entire surface of the substrate 100, and may fill the inner space defined by the preliminary basis electrode 111, e.g., completely fill the inner space without voids. The preliminary basis electrode 111 and the core insulating layer 112' may be in contact with the lower surface of the opening 108, i.e., lower surfaces of the preliminary basis electrode 111, the opening 108, and the core insulating layer 112' may be coplanar. The core insulating layer 112' may be formed of a substantially same material as the core insulating layer 112 illustrated in FIG. 5A.

Referring to FIG. 6B, the core insulating layer 112' may be planarized to expose upper surfaces of the mold insulating layer 106 and the preliminary basis electrode 111 to form a core pattern 112b in the opening 108. Next, as illustrated in FIG. 6C, an upper portion of the mold insulating layer 106 may be removed to expose an upper portion of the core pattern 112b and to form a basis electrode 111a surrounding a lower portion of the core pattern 112b. Subsequent processes to complete the phase change memory device of FIG. 4 are substantially same as the processes described previously with reference to FIGS. 5E-5H and, therefore, will not be repeated. The core pattern 112b and the basis electrode 111a correspond to the core pattern 112a and the basis electrode 110b of FIG. 5E, respectively.

Figure 10A:
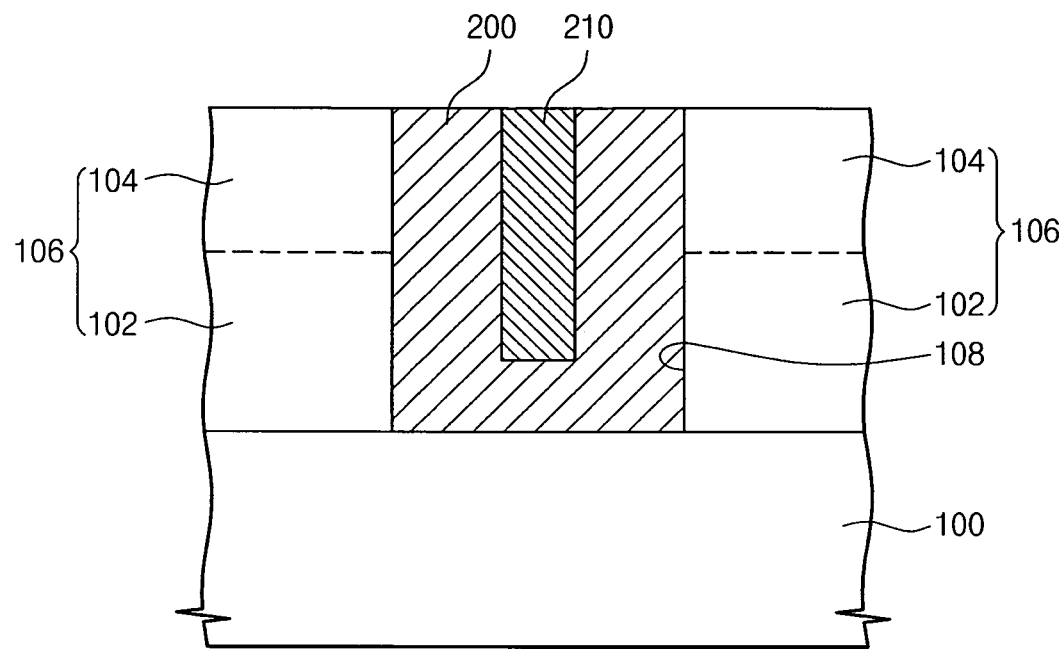
FIGS. 10A-10C illustrate cross sectional views of sequential stages in a method of forming the phase change memory device of FIGS. 7-8.
Figure 10B:
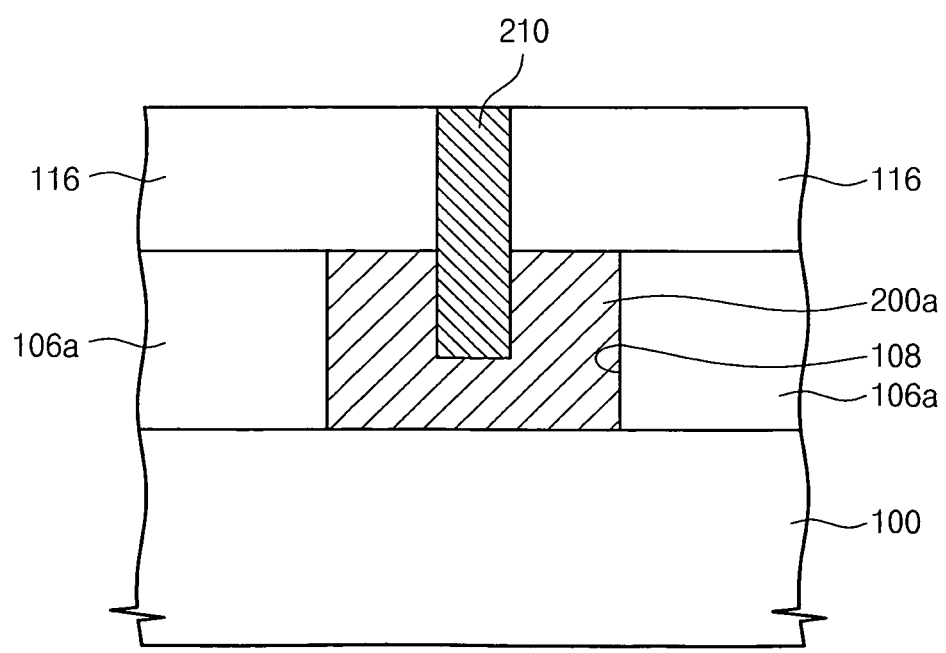
Figure 10C:
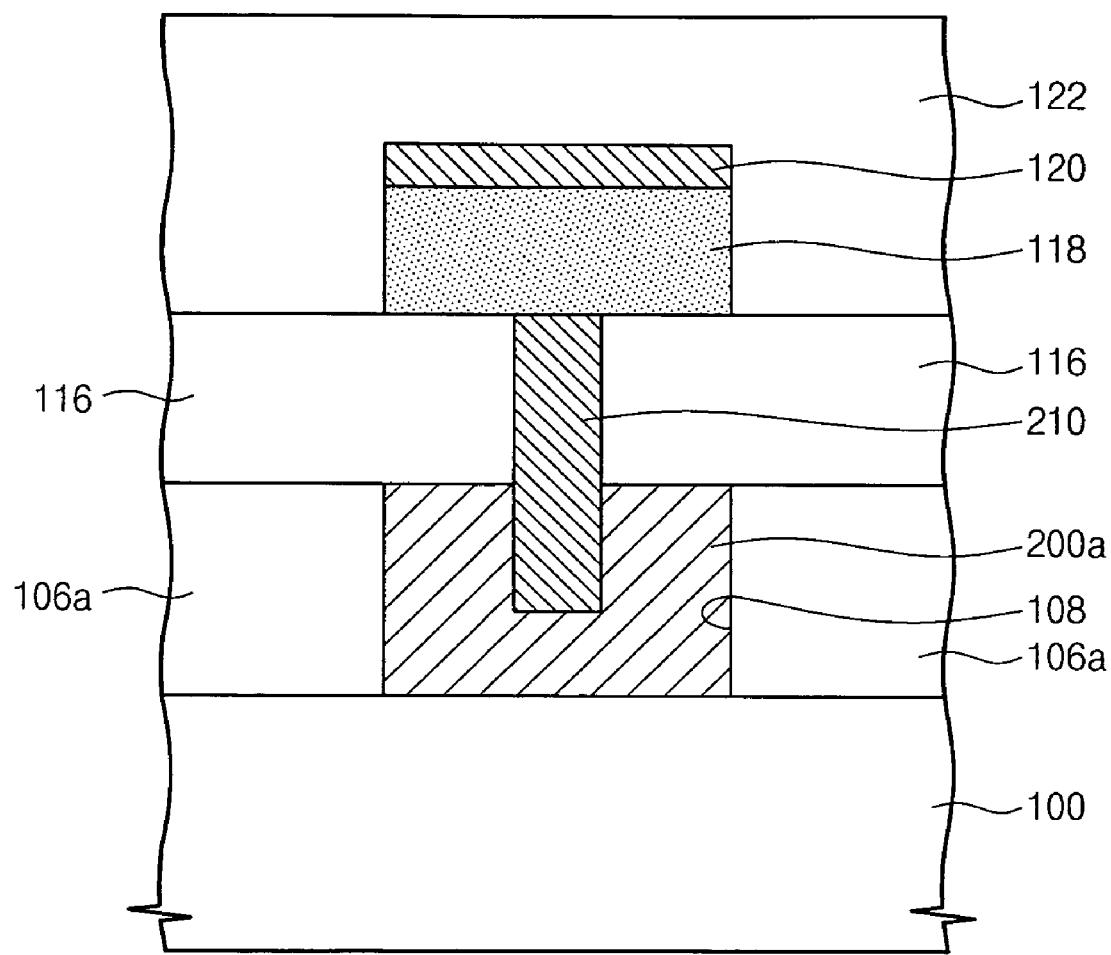

A method of forming the phase change memory device of FIGS. 7-8 will be described in more detail below. FIGS. 10A-10C illustrate cross sectional views of an exemplary method of forming the phase change memory device of FIGS. 7-8.

Referring to FIG. 10A, a method of forming the mold insulating layer 106, the opening 108 therethrough, and the basis conductive layer 110 may be substantially same as described previously with reference to FIG. 5A and, therefore, will not be repeated. A core conductive layer (not shown) may be formed on the basis conductive layer (not shown) to fill the opening 108. The core conductive layer may be formed of a conductive material having an etch selectivity with respect to the basis conductive layer. The core conductive layer and the basis conductive layer may be patterned to expose the upper surface of the mold insulating layer 106, so a conductive core pattern 210 and a preliminary basis electrode 200, respectively, may be formed in the opening 108.

Referring to FIG. 10B, an upper portion of the mold insulating layer 106 may be removed to expose an upper portion of the preliminary basis electrode 200, so a remaining mold insulating layer 106a may surround a lower portion of the preliminary basis electrode 200. Subsequently, the exposed upper portion of the preliminary basis electrode 200 may be removed to expose an upper portion of the conductive core pattern 210 and to form a basis electrode 200a. Since the conductive core pattern 210 may have an etch selectivity with respect to the preliminary basis electrode 200, the upper portion of the conductive core pattern 210 may remain and may protrude above the upper surface of the basis electrode 200a. An interlayer insulating layer may be formed on an entire surface of the substrate 100, and may be planarized to expose an upper surface of the conductive core pattern 210, so a planarized interlayer insulating layer 116 and the conductive core pattern 210 may be coplanar.

Referring to FIG. 10C, a phase change memory pattern 118 and a capping electrode 120 may be sequentially stacked on the planarized interlayer insulating layer 116, and an upper interlayer insulating layer 122 may be then formed on an entire surface of the substrate 100. Subsequently, the interconnection plug 124 and the interconnection 126 of FIG. 7 may be sequentially formed to embody the phase change memory device of FIG. 7.

Figure 11A:
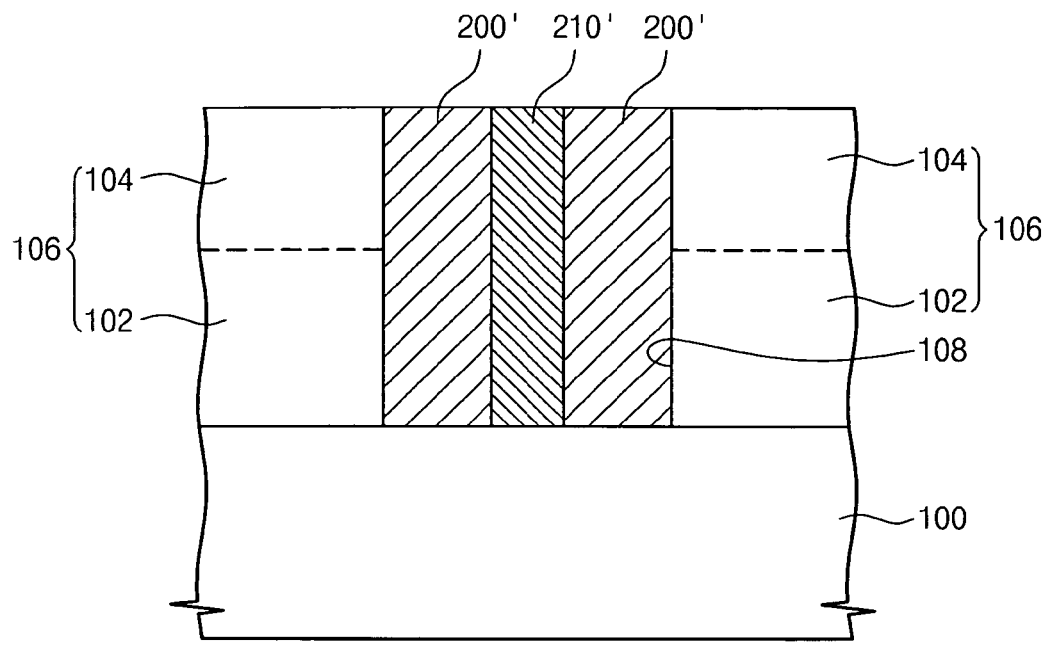
FIGS. 11A-11B illustrate cross sectional views of sequential stages in a method of forming the phase change memory device of FIG. 9.
Figure 11B:
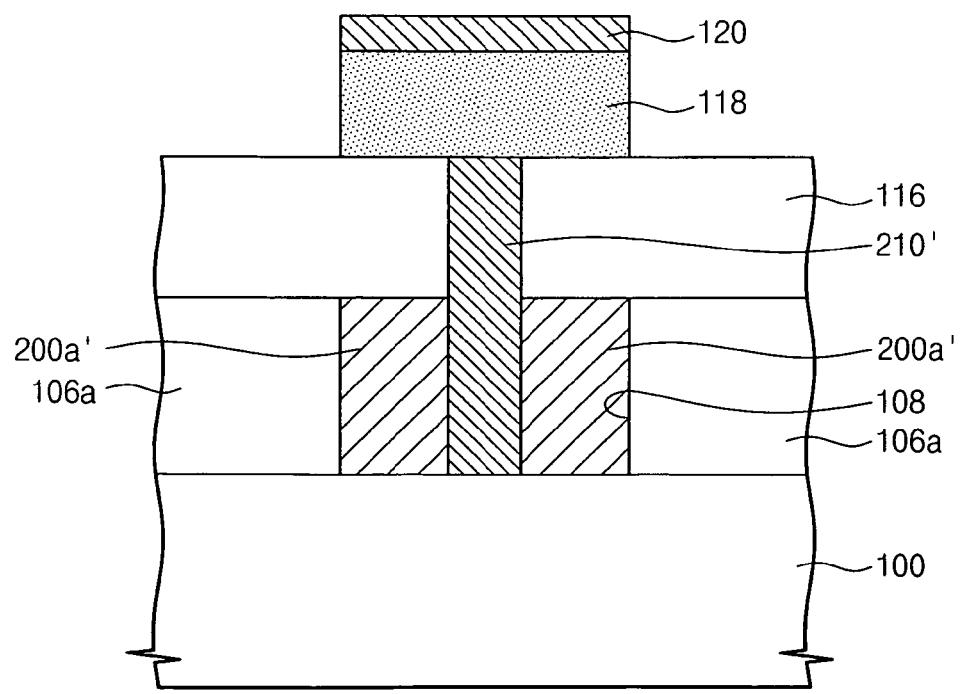

A method of forming the phase change memory device of FIG. 9 will be described in more detail below. FIGS. 11A-11B illustrate cross sectional views of an exemplary method of forming the phase change memory device of FIG. 9.

Referring to FIG. 11A, a method of forming the mold insulating layer 106, the opening 108 therethrough, and the preliminary basis electrode 200' may be substantially same as described previously with reference to the preliminary basis electrode 111 in FIG. 6A and, therefore, will not be repeated. A core conductive layer may be formed on an entire surface of the substrate 100 to fill the opening 108, followed by planarizing the core conductive layer to expose the upper surface of the mold insulating layer 106 to form a conductive core pattern 210' in the opening 108. The conductive core pattern 210' may be in contact with the bottom of the opening 108.

Referring to FIG. 11B, an upper portion of the mold insulating layer 106 may be removed to expose an upper portion of the preliminary basis electrode 200', and an upper portion of the preliminary basis electrode 200' may be removed to expose an upper portion of the conductive core pattern 210'. An interlayer insulating layer may be formed on an entire surface of the substrate 100, and the interlayer insulating layer may be planarized to expose an upper surface of the conductive core pattern 210'. A phase change memory pattern 118 and a capping electrode 120 may be sequentially formed on a planarized interlayer insulating layer 116. Subsequent processes to complete the phase change memory device of FIG. 9 are substantially same as the processes described previously with reference to FIGS. 10A-10C and, therefore, will not be repeated.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a phase change memory device, comprising:
   forming a core pattern on a substrate;
   conformally forming a heat conductive layer on the substrate including the core pattern;
   anisotropically etching the heat conductive layer down to a top surface of the core pattern to form a heat electrode surrounding a sidewall of the core pattern;
   forming a phase change memory pattern connected to a top surface of the heat electrode; and
   forming a basis electrode surrounding a lower sidewall of the core pattern, wherein the heat electrode surrounds an upper sidewall of the core pattern and has a bottom surface connected to a top surface of the basis electrode.

2. The method of claim 1, wherein a top surface of the heat electrode is narrower than the top surface of the basis electrode.

3. The method of claim 1, wherein the basis electrode surrounds the lower sidewall of the core pattern and a bottom surface of the core pattern.

4. The method of claim 3, wherein forming the core pattern and the basis electrode comprises:
   forming a mold insulating layer including an opening on the substrate;
   sequentially forming a basis conductive layer and a core insulating layer on the substrate including the opening;
   planarizing the core insulating layer and the basis conductive layer down to a top surface of the mold insulating layer to form a preliminary basis electrode and a core pattern in the opening;
   removing an upper portion of the mold insulating layer to expose an upper portion of the preliminary basis electrode; and
   removing the upper portion of the preliminary basis electrode to form the basis electrode and to expose an upper portion of the core pattern.

5. The method of claim 4, wherein the removed upper portion of the mold insulating layer includes an insulating material having an etch selectivity with respect to a lower portion of the mold insulating layer remaining on the substrate.

6. The method of claim 1, wherein a bottom surface of the basis electrode and a bottom surface of the core pattern are coplanar.

7. The method of claim 6, wherein forming the core pattern and the basis electrode comprises:
   forming a mold insulating layer including an opening on a substrate;
   conformally forming a basis conductive layer on the substrate;
   anisotropically etching back the basis conductive layer to form a preliminary basis electrode on a sidewall of the opening;
   forming a core pattern filling a space surrounded by the preliminary basis electrode in the opening;
   removing an upper portion of the mold insulating layer to expose an upper portion of the preliminary basis electrode; and
   removing the upper portion of the preliminary basis electrode to expose an upper portion of the core pattern.

8. The method of claim 7, wherein the removed upper portion of the mold insulating layer includes an insulating material having an etch selectivity with respect to a lower portion of the mold insulating layer remaining on the substrate.

9. The method of claim 1, further comprising:
   forming an interlayer insulating layer which covers the heat electrode and the core pattern on an entire surface of the substrate; and
   planarizing the interlayer insulating layer down to a top surface of the heat electrode, wherein the phase change memory pattern is formed on the planarized interlayer insulating layer.

10. The method of claim 9, before forming the phase change memory pattern, further comprising:
    recessing the planarized interlayer insulating layer to protrude upper portions of the core pattern and the heat electrode; and
    planarizing the protruded upper portions of the core pattern and the heat electrode.

* * * * *